United States Patent
Sakurayama

(10) Patent No.: US 12,017,861 B2
(45) Date of Patent: Jun. 25, 2024

(54) INSPECTION DEVICE FOR AUTO-LOADING FEEDER AND ELECTRONIC COMPONENT PICK AND PLACE MACHINE

(71) Applicant: FUJI CORPORATION, Aichi (JP)

(72) Inventor: Takeshi Sakurayama, Nisshin (JP)

(73) Assignee: FUJI CORPORATION, Aichi (JP)

( * ) Notice: Subject to any disclaimer, the term of this patent is extended or adjusted under 35 U.S.C. 154(b) by 884 days.

(21) Appl. No.: 16/978,029

(22) PCT Filed: Mar. 22, 2018

(86) PCT No.: PCT/JP2018/011436
§ 371 (c)(1),
(2) Date: Sep. 3, 2020

(87) PCT Pub. No.: WO2019/180884
PCT Pub. Date: Sep. 26, 2019

(65) Prior Publication Data
US 2021/0002081 A1    Jan. 7, 2021

(51) Int. Cl.
*H05K 13/02* (2006.01)
*B65G 43/00* (2006.01)
(Continued)

(52) U.S. Cl.
CPC ........... *B65G 43/00* (2013.01); *B65H 37/002* (2013.01); *G01B 11/14* (2013.01); *H05K 13/021* (2013.01);
(Continued)

(58) Field of Classification Search
CPC .................................................. H05K 13/021
See application file for complete search history.

(56) References Cited

U.S. PATENT DOCUMENTS 10,765,047 B2 * 9/2020 Sugimoto .............. H05K 13/02
2012/0305620 A1 12/2012 Kinoshita et al.
2016/0185093 A1 6/2016 Ohashi et al.

FOREIGN PATENT DOCUMENTS

JP    2012-156220 A    8/2012
JP    2014-157933 A    8/2014
(Continued)

OTHER PUBLICATIONS

International Search Report dated May 22, 2018 in PCT/JP2018/011436 filed on Mar. 22, 2018, 2 pages.

*Primary Examiner* — Jeffry H Aftergut
(74) *Attorney, Agent, or Firm* — Oblon, McClelland, Maier & Neustadt, L.L.P.

(57) ABSTRACT

An auto loading feeder has a tape guide main body and a peeling blade extending in the conveyance direction with an cutting edge directed towards an upstream side configured to peel off the cover tape from the base tape of the carrier tape which is guided by the tape guide main body. An inspection device for the auto loading feeder includes a height detection sensor configured to output a signal corresponding to a height position of the peeling blade with respect to a reference point on the tape guide main body, and a height discrimination section configured to discriminate whether a height position of the peeling blade with respect to the carrier tape which is being guided by the tape guide main body stays within a predetermined range based on an output signal of the height detection sensor.

9 Claims, 12 Drawing Sheets

(51) Int. Cl.
*B65H 37/00* (2006.01)
*G01B 11/14* (2006.01)
*H05K 13/08* (2006.01)

(52) U.S. Cl.
CPC ....... *H05K 13/081* (2018.08); *B65G 2203/02* (2013.01); *B65G 2203/044* (2013.01); *B65H 2701/1942* (2013.01)

(56) References Cited

FOREIGN PATENT DOCUMENTS

| | | | |
|---|---|---|---|
| JP | 2016-187058 A | | 10/2016 |
| JP | 2017-34044 A | | 2/2017 |
| TW | 201505952 A | * | 2/2015 |
| WO | WO 2015/002030 A1 | | 1/2015 |
| WO | WO 2015/029124 A1 | | 3/2015 |

\* cited by examiner

INSPECTION DEVICE FOR AUTO-LOADING FEEDER AND ELECTRONIC COMPONENT PICK AND PLACE MACHINE

TECHNICAL FIELD

The present description relates to an inspection device for an auto loading feeder and an electronic component mounter.

BACKGROUND ART

Conventionally, there has been known an auto loading feeder which peels off a cover tape during conveyance of a carrier tape in which the cover tape is affixed to a base tape and supplies a component in the carrier tape to a component supply position while leaving the component available for removal (for example, refer to Patent Literature 1). The carrier tape has the base tape having provided thereon accommodation sections where to accommodate an electronic component (hereinafter, referred to simply as a component) and the cover tape which closes the accommodation sections. The cover tape is affixed to the base tape in such a manner as to be peeled off therefrom in order to enable components accommodated in the accommodation sections to be removed therefrom.

The auto loading feeder includes a tape guide that guides the carrier tape on a conveyance path. The tape guide has a tape guide main body which extends along a conveyance direction of the carrier tape and a peeling blade which extends in the conveyance direction with a cutting edge directed to an upstream side. The tape guide main body is formed to have an upper wall section and side wall sections. An opening section is provided in the upper wall section by cutting open a portion of the upper wall section. The peeling blade extends from a downstream side of the opening section in the upper wall section of the tape guide main body in the conveyance direction obliquely downwards towards an upstream side in the conveyance direction. The peeling blade enters a boundary between the base tape and the cover tape while the carrier tape is being conveyed relative to the tape guide main body to thereby peel off the cover tape from the base tape. A height position of the cutting edge of the peeling blade becomes important in peeling off the cover tape from the base tape as described above.

In the auto loading feeder described in Patent Literature 1 described above, in order to make it easy for the cover tape to be peeled off from the base tape, there is provided a tape cutting mechanism for forming a recessed section at a distal end of the base tape. When a recessed section is formed at the distal end of the base tape by the tape cutting mechanism, a gap is formed between the base tape and the cover tape. As a result, the cutting edge of the peeling blade can be made to enter easily the gap between the base tape and the cover tape, whereby the cover tape can be peeled off from the base tape in an ensured fashion.

PATENT LITERATURE

Patent Literature 1: JP-A-2014-157933

BRIEF SUMMARY

Technical Problem

Incidentally, in the event that the height position of the peeling blade changes with respect to the tape guide main body due to deterioration with age or a thermal deformation of a mounting bracket, there may be caused a situation in which the cutting edge of the peeling blade cannot enter the gap between the base tape and the cover tape of the carrier tape which is being conveyed along the tape guide main body. With the structure in which the aforesaid tape cutting mechanism is provided which forms the recessed section at the distal end of the base tape, however, since there is provided no means for dealing with the change in the height position of the peeling blade, the fact that the cover tape cannot be peeled off from the base tape can be recognized only after it occurs.

An object of the present description is to provide an inspection device for an auto loading feeder which can detect in advance an occurrence of a state in which a height position of a peeling blade with respect to a tape guide main body changes to a height which disables peeling by the peeling blade and an electronic component mounter in which the auto loading feeder is installed.

Solution to Problem

The present description discloses an inspection device for an auto loading feeder having a tape guide main body, extending along a conveyance direction of a carrier tape, in which a cover tape for closing an accommodation section for accommodating an electronic component therein is affixed to a base tape on which the accommodation section is provided, and a peeling blade, extending in the conveyance direction with an cutting edge thereof directed towards an upstream side in the conveyance direction, which is configured to peel off the cover tape from the base tape of the carrier tape guided by the tape guide main body, the inspection device comprising: a height detection sensor configured to output a signal corresponding to a height position of the peeling blade with respect to a reference point on the tape guide main body; and a height discrimination section configured to discriminate, based on an output signal of the height detection sensor, whether a height position of the peeling blade stays within a predetermined range with respect to the carrier tape guided by the tape guide main body.

According to the present disclosure, the inspection device includes the height detection sensor which outputs a signal corresponding to a height position of the peeling blade with respect to the reference point on the tape guide main body. The output signal of the height detection sensor is sent to the height discrimination section. The height discrimination section discriminates whether the height position of the peeling blade with respect to the carrier tape which is being guided by the tape guide main body stays within the predetermined range based on the output signal of the height detection sensor. With this configuration, it is possible to detect in advance an occurrence of a state in which the height position of the peeling blade with respect to the tape guide main body changes to a position which disables the peeling of the peeling blade.

The present description discloses an electronic component mounter in which an auto loading feeder is installed, the auto loading feeder having a tape guide main body, extending along a conveyance direction of a carrier tape, in which a cover tape for closing an accommodation section for accommodating an electronic component therein is affixed to a base tape on which the accommodation section is provided, and a peeling blade, extending in the conveyance direction with an cutting edge thereof directed towards an upstream side in the conveyance direction, which is configured to peel off the cover tape from the base tape of the carrier tape guided by the tape guide main body, and which includes a transfer head configured to change its position for transfer of the electronic component in the accommodation section on the base tape from which the cover tape is peeled off, the electronic component mounter including a height detection sensor attached to the transfer head, and configured to output a signal corresponding to a height position of the peeling blade with respect to a reference point on the tape guide main body, and a height discrimination section configured to discriminate, based on an output signal of the height detection sensor, whether a height position of the peeling blade stays within a predetermined range with respect to the carrier tape guided by the tape guide main body.

According to the present disclosure, the height detection sensor, which is configured to output a signal corresponding to a height position of the peeling blade with respect to the reference point on the tape guide main body, is attached to the transfer head which can change its position for transfer of the electronic component in the accommodation section on the base tape from which the cover tape is peeled off. The output signal of the height detection sensor is sent to the height discrimination section. The height discrimination section discriminates whether the height position of the peeling blade with respect to the carrier tape which is being guided by the tape guide main body stays within the predetermined range based on the output signal of the height detection sensor. With this configuration, it is possible to detect in advance an occurrence of a state in which the height position of the peeling blade with respect to the tape guide main body changes to a position which disables the peeling of the peeling blade.

DESCRIPTION OF EMBODIMENTS

1. Configuration of Electronic Component Mounter Installing Auto Loading Feeder

Figure 1:
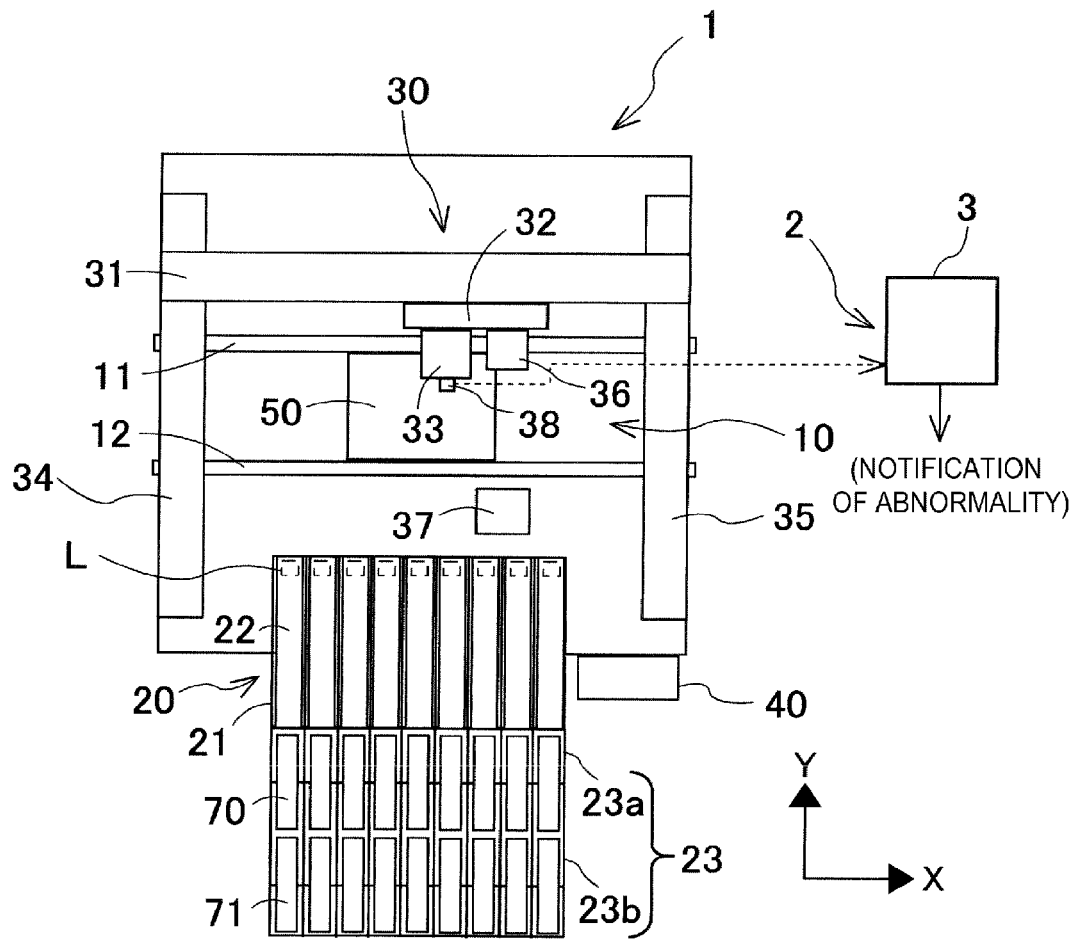
FIG. 1 is a block diagram of a whole of an electronic component mounter in which an auto loading feeder according to an embodiment is installed.
Figure 2:
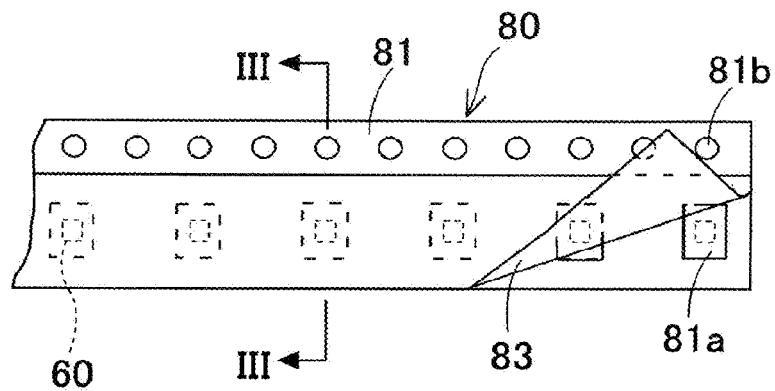
FIG. 2 is a top view of a carrier tape.
Figure 3:
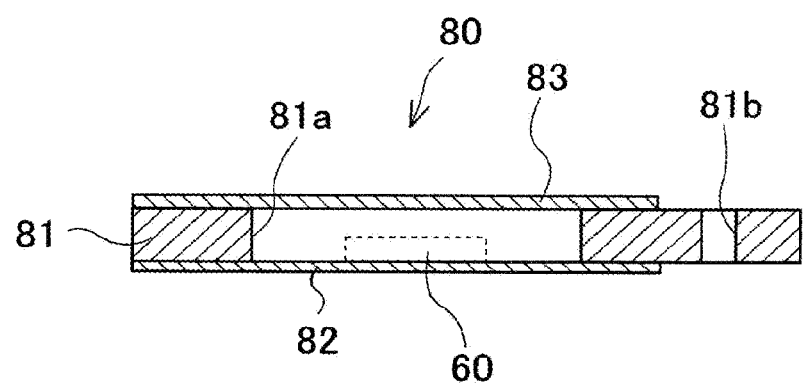
FIG. 3 is a sectional view of the carrier tape shown in FIG. 2 taken along a line III-III.

The configuration of electronic component mounter 1, which installs an auto loading feeder of an embodiment therein, will be described by use of FIGS. 1 to 3. The auto loading feeder of the present embodiment constitutes a device that is installed in electronic component mounter 1 (hereinafter, referred to simply as component mounter 1) provided on a board production line for mounting electronic components on boards. As shown in FIG. 1, component mounter 1 includes board conveyance section 10, component supply section 20, and component transfer section 30.

Board conveyance section 10 constitutes a device for conveying board 50 such as a production target circuit board. Board conveyance section 10 has pair of guide rails 11, 12, a conveyor belt (not shown), and a clamping device (not shown). Guide rails 11 and 12 are set on a base plate. Pair of guide rails 11, 12 are arranged parallel to each other at a certain interval. Guide rails 11, 12 guide board 50. The conveyor belt is a belt member on which board 50 can be placed and is provided so as to turn. The conveyor belt conveys board 50 placed thereon towards conveyance direction X in which guide rails 11, 12 extend. Board 50 is conveyed towards conveyance direction X by the conveyor belt while being guided by pair of guide rails 11, 12. The clamping device is disposed so as to position board 50 in a predetermined component mounting position. When board 50 is conveyed to the predetermined component mounting position by the conveyor belt, board 50 is positioned by the clamping device.

Component supply section 20 constitutes a device for supplying electronic component 60, which is to be mounted on board 50, to predetermined component supply position L. Electronic component 60 is a component such as a transistor, a diode, a resistor, or the like which makes up an electronic circuit. Hereinafter, electronic component 60 will be referred to simply as a component. Component 60 may include a micro component of, for example, a 0201 size (0.2 mm×0.1 mm) or the like.

Component supply section 20 has slot 21, auto loading feeder 22, and reel holding section 23. Slot 21 is attached to the base plate. Slot 21 is arranged in a direction orthogonal to conveyance direction X (hereinafter, referred to as an orthogonal direction) with respect to board conveyance section 10. Slot 21 is a holding section in which auto loading feeder 22 is removably mounted. Multiple slots 21 are provided in such a manner as to be aligned in conveyance direction X.

Reel holding section 23 can hold two reels 70, 71 in such a manner that the two reels are individually exchangeable and rotatable. Reel holding section 23 has first holding section 23a corresponding to reel 70 and second holding section 23b corresponding to reel 71. Reel holding section 23 is arranged in orthogonal direction Y with respect to auto loading feeder 22. First holding section 23a and second holding section 23b are arranged in such manner as to be aligned in orthogonal direction Y. Multiple reel holding sections 23 are provided in such a manner as to be aligned side by side in conveyance direction X so as to correspond to slots 21 in which auto loading feeders 22 are mounted. Reels 70, 71 are each a rotating body around which carrier tape 80, which accommodates multiple components 60 thereof, is wound.

Carrier tape 80 is a tape member which accommodates multiple components 60 which are arranged into a single row extending in a longitudinal direction thereof. As shown in FIGS. 2 and 3, carrier tape 80 has base tape 81 and cover tape 83. Base tape 81 is formed of a soft and flexible material such as a paper material, a resin, or the like. Accommodation holes 81a are provided in base tape 81. Accommodation hole 81a constitutes an accommodation section for accommodating component 60 therein. Accommodation holes 81a are provided at predetermined intervals in a longitudinal direction of base tape 81.

Carrier tape 80 may be of such a type that accommodation holes 81a penetrate through base tape 81 or of an embossed type in which accommodation holes 81a closed at one end by base tape 81. Additionally, in the case of carrier tape 80 having the structure in which accommodation holes 81a penetrate through base tape 81 s shown in FIG. 3, carrier tape 80 further has bottom tape 82 that is bonded to a lower face (specifically speaking, a whole of the lower face) of base tape 81 in order to prevent components 60 accommodated in accommodation holes 81a from falling off of components 60. This bottom tape 82 is formed of a transparent or translucent paper material or polymer film.

Engagement holes 81b are provided in base tape 81 in such a manner as to penetrate through base tape 81. Engagement holes 81b constitute feed holes with which engagement protrusions of a sprocket, which will be described later, are brought into engagement. Engagement holes 81b have a substantially circular or elliptical shape. Engagement holes 81b have a size enabling the engagement protrusions of the sprocket, which will be described later, to be brought into engagement therewith. Engagement holes 81b are provided at predetermined intervals in the longitudinal direction of base tape 81.

Accommodation holes 81a described above are arranged into a single row in the longitudinal direction on one or a first side of base tape 81 in a width direction thereof. Further, engagement holes 81b described above are arranged in to a single row in the longitudinal direction on the other or a second side of base tape 81 in the width direction thereof.

The interval pitch at which accommodation holes 81a are provided in the longitudinal direction of base tape 81 and the interval pitch at which engagement holes 81b are provided in the longitudinal direction of base tape 81 are made to match each other in advance. For example, the interval pitch of accommodation holes 81a may be twice the interval pitch of engagement holes 81a, or may be equal to, a half of, or the like of the interval pitch of engagement holes 81b.

Cover tape 83 is bonded to an upper face (a portion where engagement holes 81b are provided may be excluded) of base tape 81. Cover tape 83 is bonded to base tape 81 at both sides of carrier tape 80 in a width direction thereof. Cover tape 83 has a function to close upper portions of accommodation holes 81a of base tape 81 to thereby prevent components 60 accommodated in accommodation holes 81a from being dislocated therefrom. Cover tape 83 is formed of a transparent or translucent polymer film or the like.

Auto loading feeder 22 is removably mounted in corresponding slot 21. Auto loading feeder 22 constitutes a device for feeding carrier tapes 80 wound around reels 70, 71 which are held by reel holding section 23 in orthogonal direction Y which is orthogonal to conveyance direction X of board 50 to thereby supply components 60 accommodated in accommodation holes 81a of carrier tapes 80 to predetermined component supply position L. Auto loading feeder 22 will be described in detail later on.

Component transfer section 30 constitutes a device for transferring component 60 supplied to predetermined component supply position L from carrier tape 80 towards board 50 which is positioned in a predetermined component mounting position. Component transfer section 30 has Y-axis slider 31, X-axis slider 32, and mounting head 33.

Y-axis slider 31 is supported on the base table by guide rails 34, 35. Guide rails 34, 35 extend in orthogonal direction Y which is orthogonal to conveyance direction X of board 50 by board conveyance section 10 and are disposed above board conveyance section 10. Y-axis slider 31 can move towards orthogonal direction Y along guide rails 34, 35. A Y-axis servomotor (not shown) is mechanically coupled to Y-axis slider 31. Y-axis slider 31 is moved to change its position in orthogonal direction Y by the Y-axis servomotor.

X-axis slider 32 is attached to Y-axis slider 31 in such a manner as to move towards conveyance direction X. An X-axis servomotor, which is fixed to Y-axis slider 31, is mechanically coupled to X-axis slider 32. X-axis slider 32 is moved to change its position in conveyance direction X by the X-axis servomotor.

Mounting head 33 is attached to X-axis slider 32. Mounting head 33 detachably holds a suction nozzle (not shown) for picking up component 60. Mounting head 33 may be able to hold multiple suction nozzles. Mounting head 33 constitutes a transfer head which can move to change its position in up-down direction Z which is orthogonal to both conveyance direction X and orthogonal direction Y. The suction nozzle of mounting head 33 picks up component 60 supplied to predetermined component supply position L by component supply section 20 by making use of a negative pressure or the like and mounts component 60 so picked up on board 50 which is positioned in the predetermined component mounting position by releasing the negative pressure used to pick up component 60.

Board camera 36 is attached to X-axis slider 32. Board camera 36 can image a reference mark on board 50 positioned in the predetermined component mounting position from above to acquire board position reference information and can image component 60 supplied to predetermined component supply position L from above to acquire component position information. This component position information is used for position control and posture control of the suction nozzle of mounting head 33 when component 60 is picked up by the suction nozzle. Additionally, the board position reference information is used for position control and posture control of the suction nozzle of mounting head 33 when component 60 picked up by the suction nozzle is mounted on board 50.

Component camera 37 is attached to the base plate of component transfer section 30. Part camera 37 images component 60 picked up by the suction nozzle of mounting head 33 from below to thereby acquire posture information or the like of component 60 in question. This posture information is used for position control and posture control of the suction nozzle of mounting head 33 when component 60 picked by the suction nozzle is mounted on board 50.

Further, height detection sensor 38 is attached to mounting head 33. Height detection sensor 38 constitutes a sensor for measuring a height position of a predetermined portion, which will be described later on, of auto loading feeder 22 together with a height position of board 50. Information on the height position of board 50 measured by height detection sensor 38 is used for position control and posture control of the suction nozzle of mounting head 33 when component 60 picked up by the suction nozzle is mounted on board 50. Height detection sensor 38 is made up of an optical sensor, a ultrasonic sensor, or the like. Height detection sensor 38 is arranged in a position which is offset from the suction nozzle in conveyance direction X and orthogonal direction Y. The attaching position of height detection sensor 38 may be on X-axis slider 32 or board camera 36, provided that the member in question is integrated with mounting head 33.

2. Configuration of Auto Loading Feeder

Figure 4:
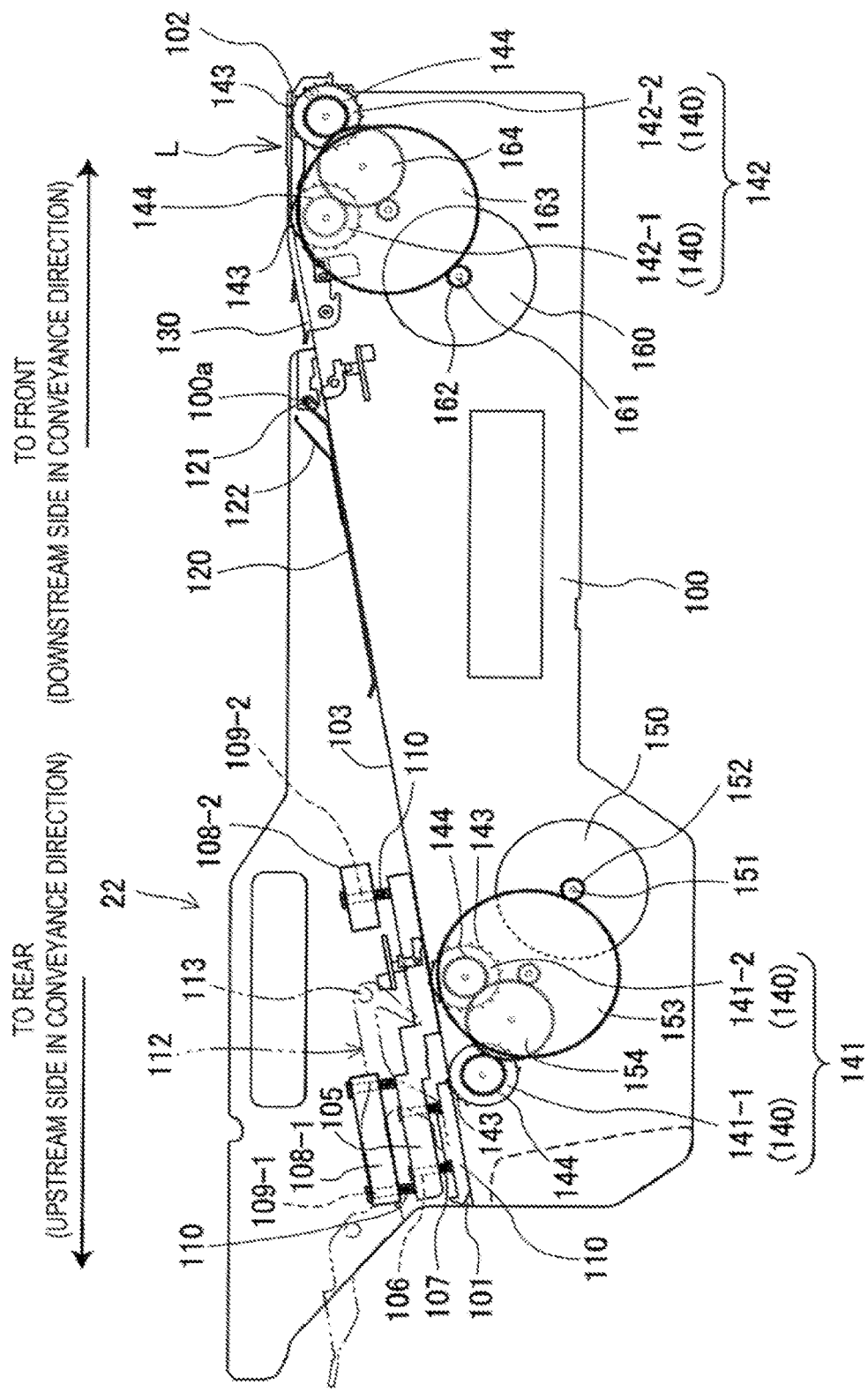
FIG. 4 is a perspective view of a side face side of the auto loading feeder of the embodiment.

Next, a detailed configuration of auto loading feeder 22 will be described by use of FIGS. 4 to 9. Auto loading feeder 22 constitutes a device for feeding carrier tapes 80 wound around reels 70, 71 held by reel holding section 23 in orthogonal direction Y to thereby supply components 60 accommodated in carrier tapes 80 to predetermined component supply position L. As shown in FIG. 4, auto loading feeder 22 includes feeder main body 100, sprockets 140, and motors 150, 160.

Feeder main body 100 is formed into a flat box shape. Feeder main body 100 has tape insertion section 101 and tape discharging section 102. Tape insertion section 101 constitutes an insertion port for inserting carrier tape 80 into auto loading feeder 22. Tape insertion section 101 is provided at a rear portion (that is, a portion at a side opposite to a side facing board conveyance section 10) of feeder main body 100. Tape discharging section 102 constitutes a discharge port for discharging carrier tape 80 to an outside of auto loading feeder 22. Tape discharging section 102 is provided at a front portion (that is, the portion at the side facing board conveyance section 10) of feeder main body 100.

Tape conveyance path 103 is provided in feeder main body 100. Tape conveyance path 103 extends from tape insertion section 101 towards tape discharging section 102 along a conveyance direction of carrier tape 80. The conveyance direction of carrier tape 80 in feeder main body 100 coincides with orthogonal direction Y which is orthogonal to conveyance direction X of board 50 described above with auto loading feeder 22 mounted in slot 21 of component supply section 20.

Tape conveyance path 103 supports a lower face and side faces of carrier tape 80, which is being conveyed, to thereby guide carrier tape 80 from tape insertion section 101 towards tape discharging section 102. Tape conveyance path 103 is formed to have a path width equal to or slightly larger than a dimension in a width direction of carrier tape 80 which is orthogonal to a longitudinal direction thereof. Tape conveyance path 103 gradually slopes up from a rear portion towards a front portion thereof. A frontmost portion of tape conveyance path 103 is formed horizontal.

Feeder main body 100 has inlet presser member 104 and downstream-side presser member 105. Inlet presser member 104 is arranged in the vicinity of tape insertion section 101 above the rear portion of tape conveyance path 103 and is formed in such a manner as to extend parallel to tape conveyance path 103. Downstream-side presser member 105 is arranged forwards (downstream) of inlet presser member 104 above tape conveyance path 103. Inlet presser member 104 and downstream-side presser member 105 are provided individually in such a manner as to move towards and away from tape conveyance path 103.

Inlet presser member 104 is arranged below a rear portion of downstream-side presser member 105 and is attached to the rear portion of downstream-side presser member 105 via pair of shafts 106. Springs 107 are attached to pair of shafts 106 in such a manner as to bias inlet presser member 104 downwards. Inlet presser member 104 has a function to press down carrier tape 80 inserted in tape insertion section 101 towards an upper face of tape conveyance path 103 when inlet presser member 104 is biased downwards by springs 107.

Downstream-side presser member 105 is attached to support members 108-1, 108-2, which are attached to feeder main body 100, via pair of shafts 109-1, 109-2. Springs 110 are attached to shafts 109-1, 109-2 in such a manner as to bias downstream-side presser member 105 downwards. Downstream-side presser member 105 has a function to press down carrier tape 80 towards tape conveyance path 103 at a downstream side of inlet presser member 104 when downstream-side presser member 105 is biased downwards by springs 110.

Sprocket 140 is a circular disk-shaped member provided below tape conveyance path 103 of feeder main body 100. Sprocket 140 is a rotating body that rotates in a direction in which carrier tape 80 is conveyed from a tape insertion section 101 side towards a tape discharging section 102 side on tape conveyance path 103 (that is, a forward direction). Sprocket 140 may be able to rotate in a direction in which carrier tape 80 is conveyed from the tape discharging section 102 side towards the tape insertion section 101 side (that is, a reverse direction).

Sprocket 140 has rear side sprocket 141 and front side sprocket 142. Rear side sprocket 141 is attached rotatably to a rear portion side of tape conveyance path 103 of feeder main body 100. Rear side sprocket 141 feeds carrier tape 80 inserted into tape insertion section 101 towards tape discharging section 102 along tape conveyance path 103 by rotating forwards. Additionally, front side sprocket 142 is attached rotatably to a front portion side of tape conveyance path 103 of feeder main body 100. Front side sprocket 142 feeds carrier tape 80, which is conveyed from tape insertion section 101 along tape conveyance path 103, towards tape discharging section 102 and further towards an outside from tape discharging section 102 by rotating forwards.

Two rear side sprockets 141 are provided along tape conveyance path 103. Hereinafter, as a matter of convenience, upstream-side (that is, rear portion-side) rear side sprocket 141 will be referred to as first rear side sprocket 141-1, and downstream-side (that is, front portion-side) rear side sprocket 141 will be referred to as second rear side sprocket 141-2. First rear side sprocket 141-1 and second rear side sprocket 141-2 rotate in the same rotational direction in synchronism with each other.

Two front side sprockets 142 are provided along tape conveyance path 103. Hereinafter, as a matter of convenience, upstream-side (that is, rear portion-side) front side sprocket 142 will be referred to as first front side sprocket 142-1, and downstream-side (that is, front portion-side) front side sprocket 142 will be referred to as second front side sprocket 142-2. First front side sprocket 142-1 and second front side sprocket 142-2 rotate in the same rotational direction in synchronism with each other.

Each sprocket 140 (specifically speaking, sprockets 141-1, 141-2, 142-1, 142-2 has engagement protrusions 143. Engagement protrusions 143 are external teeth projecting radially outwards from an outer circumference of sprocket 140. Engagement protrusions 143 of second rear side sprocket 141-2, engagement protrusions 143 of first front side sprocket 142-1, and engagement protrusions 143 of second front side sprocket 142-2 are each provided at predetermined angular intervals along a full circumference of the outer circumference thereof. On the other hand, engagement protrusions 143 of first rear side sprocket 141-1 are provided at a portion of the outer circumference thereof. That is, first rear side sprocket 141-1 has a portion, where no engagement protrusion 143 is provided, on the outer circumference thereof.

A window hole is provided in a portion of tape conveyance path 103 which is located above each sprocket 140. Each sprocket 140 is arranged in such a manner that engagement protrusion 143 lying in the vicinity of an upper end thereof protrudes upwards from tape conveyance path 103 through the window hole. Engagement protrusion 143 can be brought into engagement with engagement hole 81b of carrier tape 80 in such a state that engagement protrusion 43 protrudes upwards from tape conveyance path 103.

Engagement protrusion 143 is formed into a substantially square shape in section and is also formed in such a manner that its circumferential width becomes gradually smaller from a radially inner side towards a radially outer side, that is, in such a manner that engagement protrusion 143 has a trapezoidal shape as seen from a side thereof. Engagement protrusion 143 is sized so as to be brought into engagement with engagement hole 81b of carrier tape 80. Engagement protrusion 143 is formed so as to be brought into engagement with engagement hole 81b of carrier tape 80 in such a state that its protruding center coincides with a hole center of engagement hole 81b.

Each sprocket 140 has gear 144. Gear 144 is formed radially inwards of the outer circumference of sprocket 140 where engagement protrusions 143 are formed. Gear 144 stays below tape conveyance path 103 without protruding upwards from tape conveyance path 103 through the window hole.

Motor 150 is attached to a rear portion side of feeder main body 100. Hereinafter, this motor 150 will be referred to as rear side motor 150. Rear side motor 150 constitutes a servomotor for rotating rear side sprocket 141, that is, first rear side sprocket 141-1 and second rear side sprocket 141-2. Rear side motor 150 can rotate rear side sprockets 141-1, 141-2 in a forward direction. Rear side motor 150 may be able to rotate rear side sprockets 141-1, 141-2 in a reverse direction.

Drive gear 152 is provided on rotation shaft 151 of rear side motor 150. Drive gear 152 meshes with gears 144 of rear side sprockets 141-1, 141-2 via two gears 153, 154 which are rotatably attached to feeder main body 100. In this configuration, when rear side motor 150 is rotated, the rotation of rear side motor 150 is transmitted to first rear side sprocket 141-1 and second rear side sprocket 141-2 while being decelerated by use of gears 153, 154, whereby rear side sprockets 141-1, 141-2 rotate in synchronism with each other.

Motor 160 is attached to a front portion side of feeder main body 100. Hereinafter, this motor 160 will be referred to as front side motor 160. Front side motor 160 constitutes a servomotor for rotating front side sprocket 142, that is, first front side sprocket 142-1 and second front side sprocket 142-2. Front side motor 160 can rotate front side sprockets 142-1, 142-2 in a forward direction. Front side motor 160 may be able to rotate front side sprockets 142-1, 142-2 in a reverse direction.

Drive gear 162 is attached to rotational shaft 161 of front side motor 160. Drive gear 162 meshes with gears 144 of front side sprockets 142-1, 142-2 via two gears 163, 164 which are rotatably attached to feeder main body 100. In this configuration, when front side motor 160 is rotated, the rotation of front side motor 160 is transmitted to first front side sprocket 142-1 and second front side sprocket 142-2 while being decelerated by use of gears 163, 164, whereby front side sprockets 142-1, 142-2 rotate in synchronism with each other.

Operation lever 112 is provided on feeder main body 100. Operation lever 112 is provided above a position where tape insertion section 101 of feeder main body 100 lies in such a manner as to protrude towards the rear. Operation lever 112 is supported at a rear portion of feeder main body 100 in such a manner as to rotate about pivot 113. Operation lever 112 is operated to rotate about pivot 113 by the operator.

Figure 5:
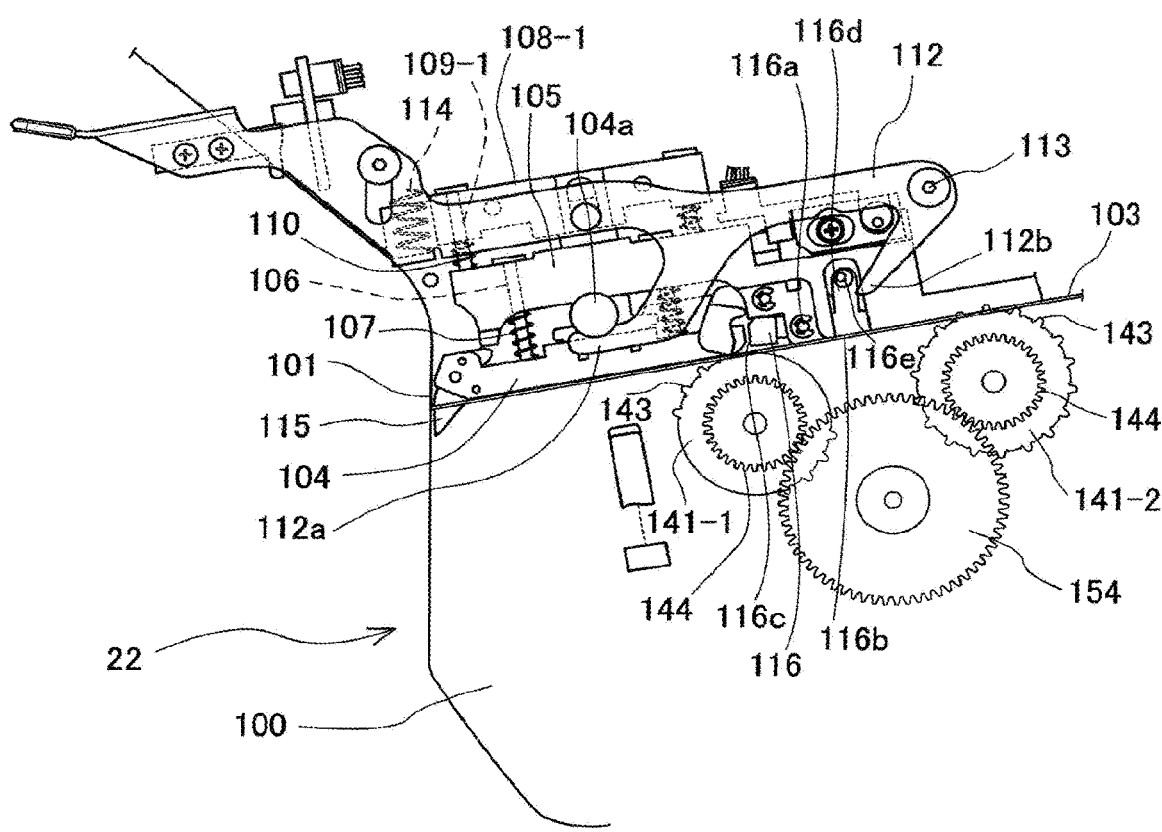
FIG. 5 is an enlarged view of a rear portion on the side face side of the auto loading feeder of the embodiment.

Inlet presser member 104 is operatively coupled to operation lever 112. As shown in FIG. 5, inlet presser member 104 has engagement member 104a which is arranged between pair of shafts 106. Operation engaging section 112a is provided at a longitudinally central portion of operation lever 112. Operation engaging section 112a is in engagement with a lower face of engagement member 104a of inlet presser member 104. Operation lever 112 is rotated in a predetermined direction (in a counterclockwise direction in FIG. 5) by the biasing force of springs 114. In a normal state in which a force resisting the biasing force of springs 114 (that is, a force in an opposite direction (a clockwise direction in FIG. 5) to a rotational direction in which operation lever 112 is rotated by the biasing force of springs 114) is not applied to operation lever 112, as shown in FIG. 5, operation engaging section 112a is held in a predetermined lower end position, and inlet presser member 104 is pressed towards tape conveyance path 103 by means of the biasing force of springs 107, whereby new carrier tape 80 cannot be inserted into tape insertion section 101.

Figure 6:
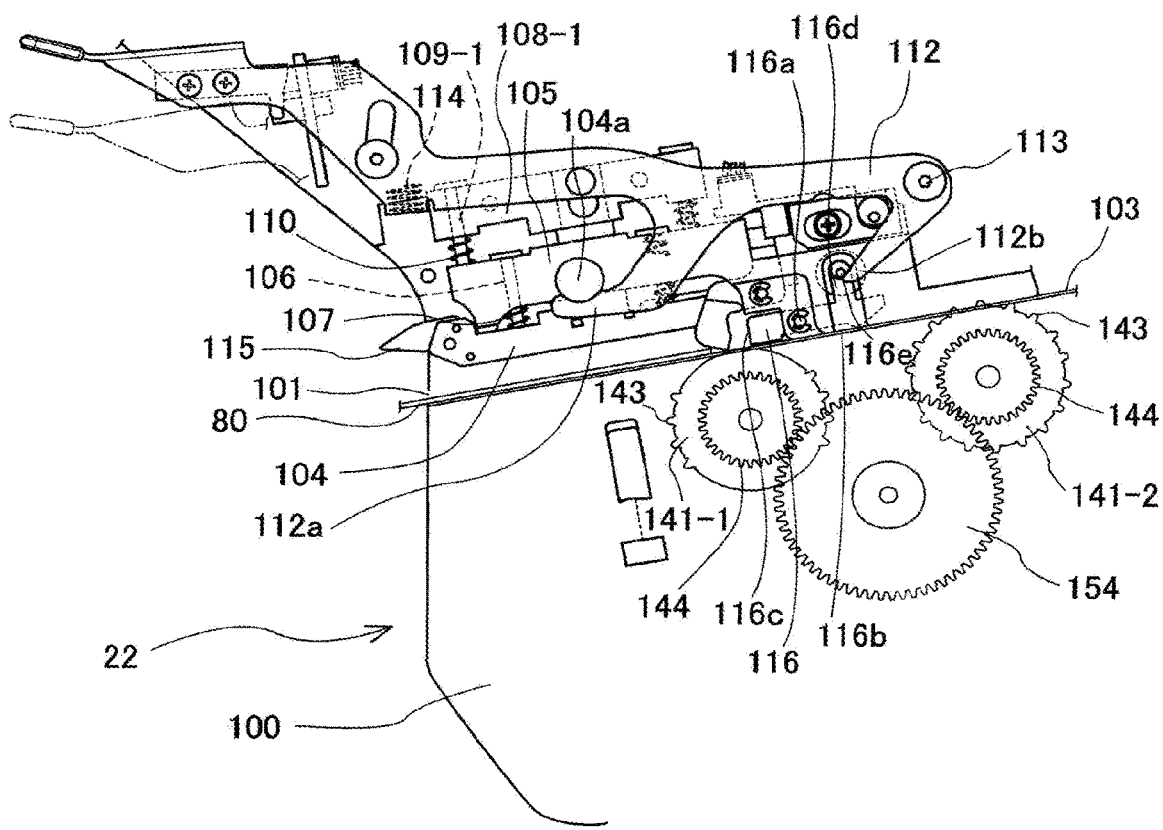
FIG. 6 is an enlarged view of the rear portion on the side face side of the auto loading feeder of the embodiment in such a state that an operation lever is uplifted.

On the other hand, as shown in FIG. 6, when operation lever 112 is uplifted upwards by the operator, whereby operation lever 112 is rotated about pivot 113 against the biasing force of springs 114, operation engaging section 112a rises, whereby inlet presser member 104 is raised against the biasing force of springs 107. Consequently, when the operator uplifts operation lever 112, inlet presser member 104 moves away from tape conveyance path 103, whereby new carrier tape 80 can be inserted into tape insertion section 101.

Baffle plate 115 is pivotally supported at a rear portion of inlet presser member 104. Baffle plate 115 has a function to disable the insertion of new carrier tape 80 by closing tape insertion section 101 by its own weight in such a state that inlet presser member 104 is pressed towards tape conveyance path 103. Baffle plate 115 is brought into engagement with a rear portion of downstream-side presser member 105 to thereby be rotated when inlet presser member 104 rises, enabling new carrier tape 80 to be inserted into tape insertion section 101.

Stopper member 116 is provided adjacent to a downstream side of inlet presser member 104. Stopper member 116 is supported rotatably on downstream-side presser member 105 by shaft support section 116a provided at a central portion of stopper member 116. Abutting section 116b is provided on stopper member 116. Abutting section 116b is provided at a lower portion of stopper member 116 which lies forwards of shaft support portion 116a. Abutting section 116b constitutes a portion protruding downwards to be brought into abutment with tape conveyance path 103. Abutting section 116b is biased in a direction in which abutting section 116b is brought into abutment with tape conveyance path 103 by a spring (not shown) provided between downstream-side presser member 105 and stopper member 116.

Stopping section 116c is provided at a rear end portion of stopper member 116. Stopping section 116c is provided in such a manner as to move towards and away from tape conveyance path 103. Stopping section 116c has a rear surface with which a distal end of carrier tape 80 can be brought into abutment and has a function to prevent carrier tape 80 in question from being conveyed to a downstream side when it is brought into abutment with tape conveyance path 103. Stopping section 116c is arranged in a boundary position where engagement hole 81b of carrier tape 80, which is brought into abutment with the rear surface of stopping section 116c at a distal end thereof, is nearly brought into engagement with engagement protrusion 143 of first rear side sprocket 141-1. This engagement is an engagement that is realized in such a state that stopping section 116c stays away from tape conveyance path 103.

Protruding section 116d is provided on stopper member 116. Protruding section 116d is provided at an upper portion of stopper member 116 which lies forwards of shaft support section 116a. Protruding section 116d protrudes upwards. Cam follower 116e is provided at a distal end of protruding section 116d. Cam section 112b is formed at a front portion of operation lever 112. Cam section 112b is in engagement with cam follower 116e in such a manner as to be disengaged therefrom.

As shown in FIG. 5, in such a state that operation lever 112 is rotated in the predetermined direction by means of the biasing force of springs 114 to be held in the position where inlet presser member 104 is in abutment with tape conveyance path 103, cam section 112b of operation lever 112 stays away from cam follower 116e of stopper member 116. In this case, stopper member 116 is rotated about shaft support section 116a in the opposite direction by the biasing force of the spring, not shown and is held in such a state that abutting section 116b is in abutment with tape conveyance path 103, and stopping section 116c stays away from tape conveyance path 103.

On the other hand, as shown in FIG. 6, when operation lever 112 is rotated against the biasing force of springs 114, cam section 112b of operation lever 112 is brought into engagement with cam follower 116e of stopper member 116. In this case, stopper member 116 is rotated about shaft support section 116a in the predetermined direction against the biasing force of the spring, not shown, bringing stopping section 116c into abutment with tape conveyance path 103. When carrier tape 80 is inserted into tape insertion section 101 in that state, carrier tape 80 so inserted enters between a tape upper face biasing member and a tape lower face biasing member of feeder main body 100 and is thereafter brought into abutment with stopping section 116c of stopper member 116 at a distal end thereof to thereby be stopped.

After carrier tape 80 (hereinafter, this carrier tape 80 will be referred to as old carrier tape 80) passes through a gap between tape conveyance path 103 and abutting section 116b of stopper member 116, abutting section 116b is uplifted by that carrier tape 80, thereby bringing stopping section 116c of stopper member 116 into abutment with tape conveyance path 103. When new carrier tape 80 (hereinafter, this carrier tape 80 will be referred to as new carrier tape 80) is inserted into tape insertion section 101 to be superimposed on older carrier tape 80 under the conditions described above, new carrier tape 80 enters the gap between the tape upper face biasing member and the tape lower face biasing member and is thereafter brought into abutment with stopping section 116c of stopper member 116 at a distal end thereof to thereby be stopped. Thus, new carrier tape 80 is prevented from being conveyed towards the downstream side while old carrier tape 80 is being conveyed on tape conveyance path 103, whereby new carrier tape 80 is caused to wait in that position.

As shown in FIG. 4, feeder main body 100 has upper face presser member 120. Upper face presser member 120 is arranged above tape conveyance path 103 between second rear side sprocket 141-2 and first front side sprocket 142-1 and is formed in such a manner as to extend parallel to tape conveyance path 103. Shaft support section 121 is formed at a front end portion of upper face presser member 120. Shaft support section 121 is pivotally supported at a shaft section provided on feeder main body 100. Upper face presser member 120 is attached to feeder main body 100 in such a manner as to oscillate at shaft support section 121. Upper face presser member 120 is biased downwards by biasing member 122 such as a torsion spring or the like. Upper face presser member 120 has a function to presses down the upper face of carrier tape 80 which is being conveyed along tape conveyance path 103 so as to prevent carrier tape 80 from being caused to rise from tape conveyance path 103 when upper face presser member 120 is biased downwards by biasing member 122.

Tape guide 130 is provided on feeder main body 100. Tape guide 130 guides carrier tape 80 on tape conveyance path 103 in a width direction and in an up-down direction thereof. Tape guide 130 may be attached to feeder main body 100 as a separate body or may be provided integrally with feeder main body 100. Tape guide 130 has tape guide main body 131 and tape peeling device 135.

Figure 8:
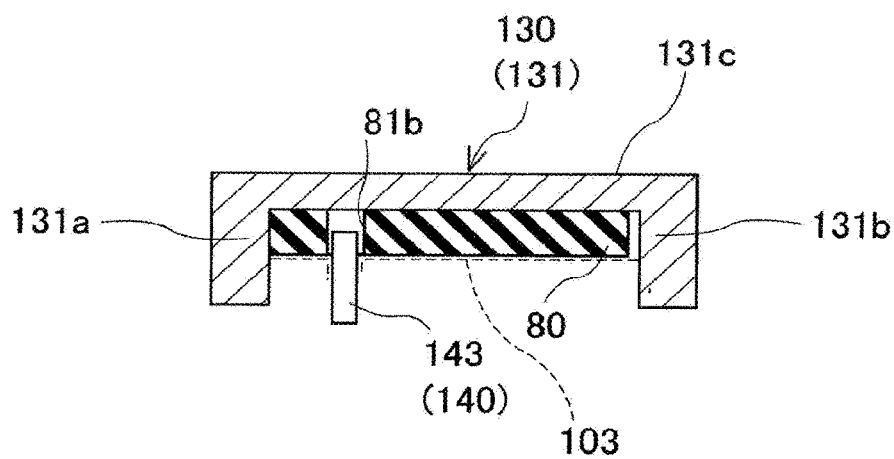
FIG. 8 is a diagram showing a positional relationship between a tape guide and the carrier tape which is generated when the carrier tape is fed in the feeder of the embodiment.
Figure 9:
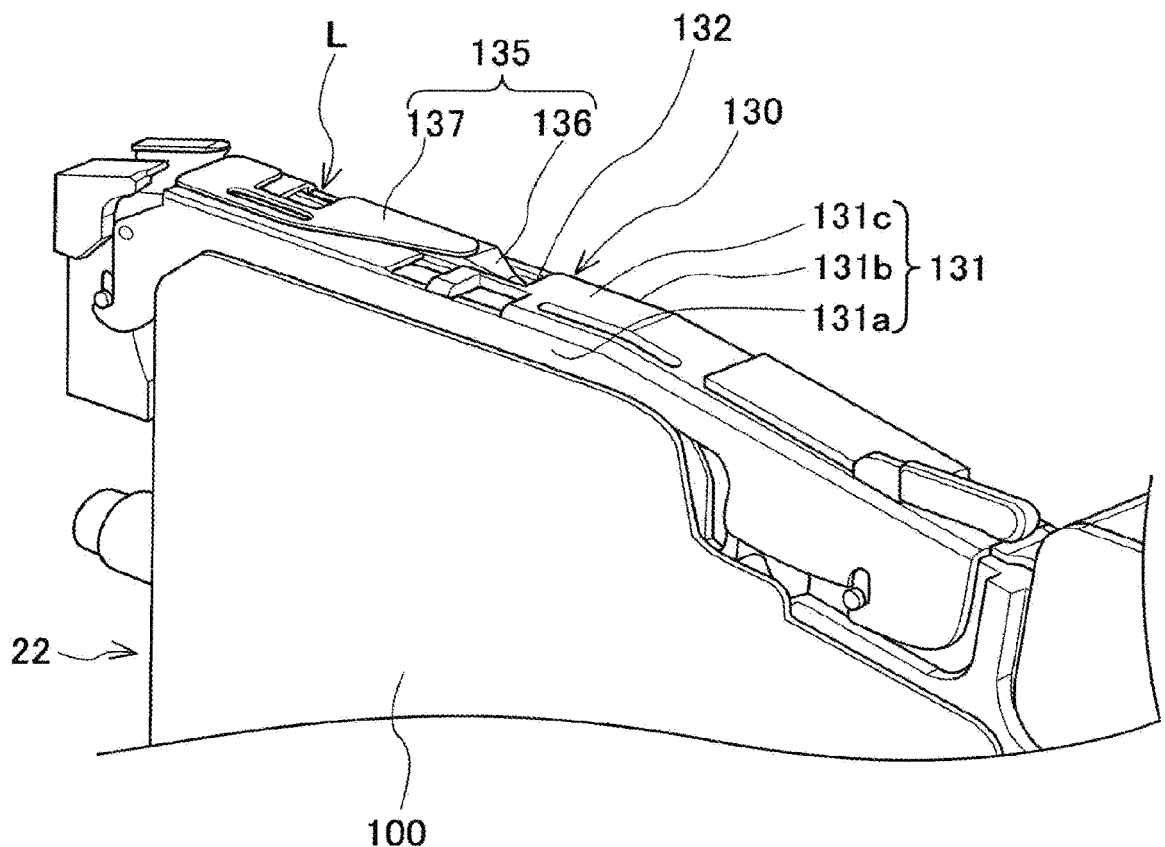
FIG. 9 is a perspective view of a front portion of the auto loading feeder of the embodiment.

Tape guide main body 131 extends in orthogonal direction Y, which constitutes the conveyance direction of carrier tape 80, that is, along tape conveyance path 103 and covers tape conveyance path 103 in question. Tape guide main body 131 is arranged at a downstream side of tape conveyance path 103 in the conveyance direction. As shown in FIG. 8, tape guide main body 131 has two side wall sections 131a, 131b, which hold tape conveyance path 103 therebetween, and upper wall section 131c connecting both side wall sections 131a, 131b together. Tape guide main body 131 is formed into, for example, a U-shape in section. Both side wall sections 131a, 131b of tape guide main body 131 are arranged to face each other in parallel with tape conveyance path 103 held therebetween. As shown in FIG. 9, opening section 132 is formed in upper wall section 131c of tape guide main body 131 by cutting out a portion thereof.

Tape peeling device 135 is provided integrally with tape guide main body 131. Tape peeling device 135 has peeling blade 136 and folding member 137. Peeling blade 136 constitutes a blade member for peeling off cover tape 83 from carrier tape 80 at an upstream side of component supply position L in the conveyance direction so as to generate a state in which component 60 can be removed from accommodation hole 81*a* in component supply position L. A distal end portion of peeling blade 136 has a sharp cutting edge for peeling off an adhesive section on one or a first side of sides of carrier tape 80 in the width direction (specifically speaking, an adhesive section on an opposite side to a side where engagement holes 81*b* are formed).

Peeling blade 136 is arranged at an upstream side of component supply position L in the conveyance direction and is arranged, for example, a downstream side of first front side sprocket 142-1 in the conveyance direction and at an upstream side of second front side sprocket 142-2 in the conveyance direction. Peeling blade 136 extends obliquely downwards from a downstream side in the conveyance direction to an upstream side in the conveyance direction of opening section 132 in upper wall section 131*c* of tape guide main body 131. A height position of the cutting edge of peeling blade 136 lies downwards of a ceiling surface (that is, a rear face) of upper wall section 131*c* which lies on a side facing tape conveyance path 103. In addition, predetermined component supply position L is positioned downstream of a cutting edge position of peeling blade 136 in the conveyance direction.

Further, folding member 137 constitutes a member for raising one or a first side of cover tape 83, which is peeled off, in a width direction thereof (specifically speaking, a side of carrier tape 80 where accommodation holes 81*a* for accommodating components 60 are arranged) to thereby fold back cover tape 83 in question. Folding member 137 is formed into a plate-like shape. Folding member 137 is arranged at a downstream side in the conveyance direction with respect to peeling blade 136 and is arranged at an upstream side in the conveyance direction with respect to component supply position L. Folding member 137 is arranged in such a manner that a part of peeling blade overlaps peeling blade 136.

3. Operation of Auto Loading Feeder

In auto loading feeder 22 that has been described heretofore, old carrier tape 80 is wound around reel 70 held in first holding section 23*a*, and new carrier tape 80 is wound around reel 71 held in second holding section 23*b*. In the normal state in which operation lever 112 is held by means of the biasing force of springs 114, as shown in FIG. 5, operation lever 12 is held in the position where inlet presser member 104 is brought into abutment with tape conveyance path 103, and baffle plate 115 is rotated by its own weight to thereby close tape insertion section 101.

When operation lever 112 is operated to be uplifted against the biasing force of springs 114 in that state, as shown in FIG. 6, operation engaging section 112*a* rises, whereby inlet presser member 104 is raised against the biasing force of springs 107. In this case, inlet presser member 104 moves away from tape conveyance path 103, and baffle plate 115 is rotated by downstream-side presser member 105 to thereby release tape insertion section 101 to a state which enables carrier tape 80 to be inserted into tape insertion section 101. At the same time, stopper member 116 is rotated by cam section 112*b* of operation lever 112, whereby stopping section 116*c* is brought into abutment with tape conveyance path 103.

Figure 7:
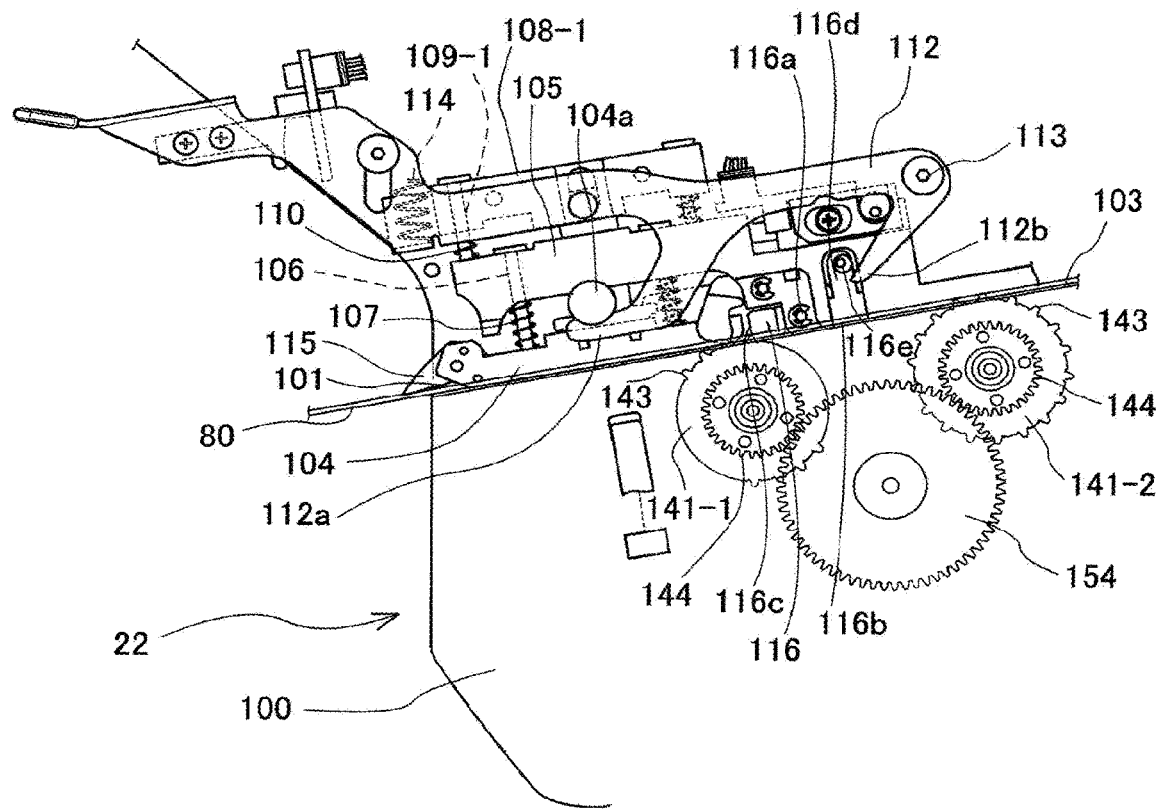
FIG. 7 is an enlarged view of the rear portion on the side face side of the auto loading feeder of the embodiment in such a state that the carrier tape is conveyed with the operation lever uplifted.

When old carrier tape 80 is inserted from tape insertion section 101 onto tape conveyance path 103 by the operator in that state, a distal end of old carrier tape 80 can be inserted as deep as a position where the distal end comes into abutment with stopping section 116*c* of stopper member 116. When the uplifting operation of operation lever 112 is released in such a state that old carrier tape 80 has been inserted to the position where it comes into abutment with stopping section 116*c*, operation lever 112 is rotated by means of the biasing force of springs 114 to thereby be allowed to return to its original position. In this origin restored state, as shown in FIG. 7, inlet presser member 104 is caused to be lowered towards tape conveyance path 103 by means of the biasing force of springs 107, whereby inlet presser member 104 presses down old carrier tape 80 towards tape conveyance path 103, and baffle plate 115 is rotated by its own weight to thereby close tape insertion section 101. At the same time, stopper member 116 brings abutting section 116*b* into abutment with tape conveyance path 103 by means of the biasing force of the spring and causes stopping section 116*c* to move away from tape conveyance path 103.

When the insertion of old carrier tape 80 into tape insertion section 101 is detected, the existence of old carrier tape 80 on tape conveyance path 103 is detected, and the return of operation lever 112 to the original position is detected by using various sensors, rear side motor 150 is driven to rotate first and second rear side sprockets 141-1, 141-2 in the forward direction. When rear side motor 150 is driven in that manner, first and second rear side sprockets 141-1, 141-2 are caused to rotate in the forward direction.

In this case, firstly, first rear side sprocket 141-1 rotates forwards with its engagement protrusion 143 kept in engagement with engagement hole 81*b* of old carrier tape 80 while a distal end side of old carrier tape 80 is allowed to be conveyed from stopping section 116*c* towards the downstream side in the conveyance direction as a result of stopping section 116*c* moving away from tape conveyance path 103, whereby old carrier tape 80 is conveyed towards the tape discharging section 102 side as a result of first rear side sprocket 141-1 rotating forwards. When old carrier tape 80 is so conveyed, downstream-side presser member 105 is uplifted against the biasing force of springs 110 by old carrier tape 80, whereby old carrier tape 80 in question is conveyed between downstream-side presser member 105 and tape conveyance path 103.

As described above, engagement protrusions 143 of first rear side sprocket 141-1 are provided only the part of the outer circumference of first rear side sprocket 141-1. Due to this, after engagement protrusion 143 is brought into engagement with engagement hole 81*b* of old carrier tape 80, old carrier tape 80 in question is fed intermittently towards the tape discharging section 102 side. Thus, a quick pull on carrier tape 80 by first rear side sprocket 141-1 is avoided. When downstream-side presser member 105 is uplifted, shaft support section 116*a* of stopper member 116 is raised together therewith.

When the conveyance of old carrier tape 80 by the forward rotation of first rear side sprocket 141-1 progresses, engagement protrusion 143 of second rear side sprocket 141-2 is brought into engagement with engagement hole 81*b* at the distal end side of old carrier tape 80 in question. After the engagement of engagement protrusion 143 with engagement hole 81*b* is executed in the way described above, old carrier tape 80 in question is conveyed towards the tape discharging section 102 side by the forward rotation of second rear side sprocket 141-2. As described above, engagement protrusions 143 of second rear side sprocket 141-2 are provided along the full circumference of the outer circumference of second rear side sprocket 141-2. As a result, after engagement protrusion 143 of second rear side sprocket 141-2 is brought into engagement with engagement hole 81b of old carrier tape 80, old carrier tape 80 in question is moved to tape discharging section 102 within a short period of time.

When old carrier tape 80 is conveyed as a result of second rear side sprocket 141-2 rotating forwards, firstly, the distal end of old carrier tape 80 in question enters underneath upper face presser member 120 from a gap between a guide section formed at a rear end portion of upper face presser member 120 and tape conveyance path 103. As a result, a distal end side of old carrier tape 80 in question is conveyed towards a front side sprocket 142 side while being restrained from rising from tape conveyance path 103 by upper face presser member 120.

When an arrival of the distal end of old carrier tape 80 at an upstream side of first front side sprocket 142-1 in the conveyance direction, which is attained as a result of the conveyance of old carrier tape 80 being progressed by the forward rotation of second rear side sprocket 141-2, is detected by use of a sensor, rear side motor 150 and front side motor 160 are driven to cause first and second rear side sprockets 141-1, 141-2 and front side sprockets 142-1, 142-2 to rotate forwards intermittently. When rear side motor 150 and front side motor 160 are so driven, each of rear side sprockets 141 and each of front side sprockets 142-1, 142-2 are caused to rotate in the forward direction intermittently. An angle of one rotational operation of these intermittent rotations may correspond to the pitch interval at which components 60 are accommodated in carrier tape 80.

When engagement protrusion 143 of first front side sprocket 142-1 is brought into engagement with engagement hole 81b of old carrier tape 80 in that state, old carrier tape 80 in question is conveyed towards the tape discharging section 102 side by the forward rotation of first front side sprocket 142-1, and cover tape 83 is peeled off from carrier tape 80 by the cutting edge of peeling blade 136 of tape peeling device 135 entering a boundary between base tape 81 and cover tape 83. Then, when engagement protrusion 143 of second front side sprocket 142-2 is brought into engagement with engagement hole 81b of old carrier tape 80 in question, old carrier tape 80 in question is conveyed towards the tape discharging section 102 side as a result of second front side sprocket 142-2 rotating forwards. Components 60 accommodated in old carrier tape 80 are positioned in component supply position L and is then transferred by component transfer section 30 every time rear side sprockets 141 and front side sprockets 142 stop rotation while they are rotating intermittently.

In addition, since old carrier tape 80 presses abutting section 116b of stopper member 116 to uplift abutting section 116b while old carrier tape 80 in question is being conveyed on tape conveyance path 103, stopper member 116 is caused to rotate about shaft support section 116a against the biasing force of the spring. As a result, stopping section 116c of stopper member 116 comes into contact and then into abutment with an upper face of old carrier tape 80 in question.

When operation lever 112 is uplifted and is then caused to rotate against the biasing force of springs 114 in that state, inlet presser member 104 moves away from tape conveyance path 103, and baffle plate 115 releases tape insertion section 101 to open, whereby new carrier tape 80 is allowed to be inserted into tape insertion section 101. Then, when a distal end side of new carrier tape 80 is inserted through tape insertion section 101 into a gap between old carrier tape 80 and inlet presser member 104, a distal end of new carrier tape 80 in question enters between the tape upper face biasing member and the tape lower face biasing member and is thereafter brought into abutment with stopping section 116c of stopper member 116, whereby the conveyance of new carrier tape 80 in question is stopped in that position. As a result, new carrier tape 80 is prevented from being conveyed to the downstream side.

As described above, when the uplifting operation of operation lever 112 is released in such a state that new carrier tape 80 is inserted into the position where it comes into abutment with stopping section 116c, operation lever 112 in question is caused to rotate by means of the biasing force of the springs 114 to return to its original position. As this occurs, since abutting section 116b of stopper member 116 is uplifted by new carrier tape 80, new carrier tape 80 is kept stopped by stopping section 116c of stopper member 116.

When a tail end of old carrier tape 80, which is a rear end of old carrier tape 80, is conveyed further downstream in the conveyance direction than a distal end of new carrier tape 80, which is a front end of new carrier tape 80, in such a state that new carrier tape 80 is kept stopped as described above, new carrier tape 80 in question contacts an upper face of tape conveyance path 103 which lies upstream of old carrier tape 80 in the conveyance direction, and then, engagement protrusion 143 of first rear side sprocket 141-1 is brought into engagement with engagement hole 81b of new carrier tape 80. Then, new carrier tape 80 enters a gap defined between tape conveyance path 103 and stopper member 116 as a result of the existence of old carrier tape 80 and is then conveyed towards the tape discharging section 102 side as first front side sprocket 142-1 rotates forwards. When the distal end of new carrier tape 80 uplifts abutting section 116b, as described above, stopper member 116 is caused to rotate against the biasing force of the spring, whereby the entrance of carrier tape 80 is prevented by stopping section 116c.

In this way, in the event that two carrier tapes 80 are inserted on tape conveyance path 103, when the conveyance of first carrier tape 80 ends, the conveyance of second carrier tape 80 can be started. As a result, two carrier tapes 80 can be conveyed continuously in terms of time without conveying two carrier tapes 80 from stopping section 116c towards the downstream side in the conveyance direction while being superposed on each other, whereby components 60 accommodated in carrier tapes 80 can be supplied continuously to component supply position L without any interruption. Additionally, components 60 accommodated in carrier tape 80 can be supplied to predetermined component supply position L by driving both rear side motor 150 and front side motor 160 so as to cause corresponding sprockets 140 to rotate forwards.

4. Height Measurement of Predetermined Portion of Auto Loading Feeder

Incidentally, in auto loading feeder 22, carrier tape 80 is conveyed on tape conveyance path 103 in such a state that carrier tape 80 is in contact with the ceiling surface of upper wall section 131c of tape guide main body 131 at an upstream side of peeling blade 136 in the conveyance direction. Cover tape 83 is peeled off from base tape 81 by peeling blade 136 entering the boundary between base tape 81 and cover tape 83 while carrier tape 80 is being conveyed in the way described above. The cutting edge of peeling blade 136 is positioned below the ceiling surface of upper wall portion 131c of tape guide main body 131, and peeling blade 136 is arranged so that the cutting edge thereof is positioned within a predetermined height range with respect to the ceiling surface of upper wall section 131c. The predetermined height range described above corresponds to the thickness of cover tape 83 and is set at a position lying, for example, 0.14 mm to 0.20 mm lower than the ceiling surface of upper wall section 131c.

When cover tape 83 is peeled off from base tape 81, base tape 81, in which accommodation holes 81a where to accommodate components 60 are provided, is fed towards the tape discharging section 102 after passing underneath peeling blade 136, while cover tape 83, which is peeled off from the base tape 81, passes over peeling blade 136 and is then folded back on one or a first side thereof in the width direction by folding member 137, eventually being discharged to an outside of auto loading feeder 22.

Inspection device 2 for inspecting auto loading feeder 22 includes height detection sensor 38 and control section 3, as shown in FIG. 1. Height detection sensor 38 constitutes a sensor for outputting a signal corresponding to a height position of peeling blade 136 with respect to tape guide main body 131 of tape guide 130 of auto loading feeder 22. Specifically speaking, height detection sensor 38 outputs a signal corresponding to height position T1 of upper wall section 131c of tape guide main body 131 and outputs a signal corresponding to height position T2 of peeling blade 136. Height detection sensor 38 is, for example, a reflection-type photoelectric sensor having a light projecting section and a light receiving section configured to receive a reflected radiation of light irradiated from the light projecting section, or the like. Height detection sensor 38 is attached to mounting head 33 in such a manner that the light projecting section irradiates light vertically downwards.

Figure 10:
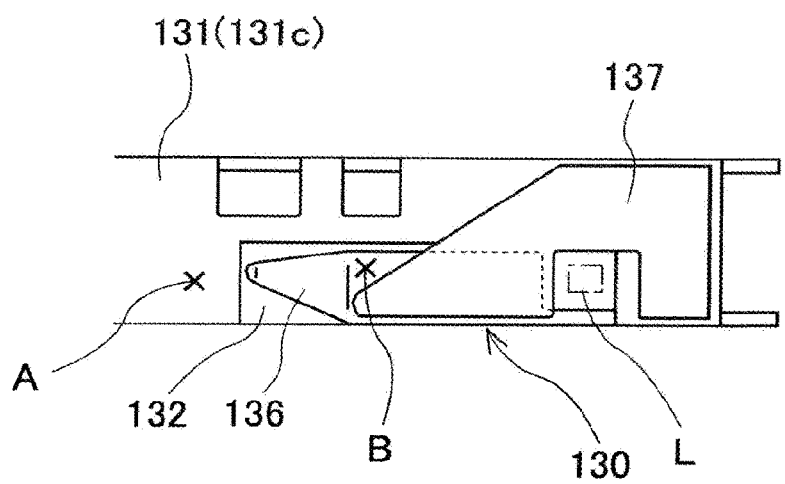
FIG. 10 is a top view of an area in the vicinity of a peeling blade of the tape guide of the auto loading feeder of the embodiment.
Figure 11:
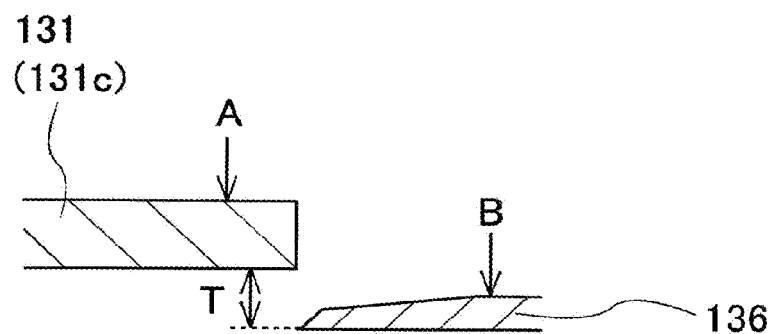
FIG. 11 is a sectional view of the area in the vicinity of the peeling blade of the tape guide of the auto loading feeder of the embodiment.

A portion of tape guide main body 131 where upper wall section 131c is located, which constitutes a measuring target to be measured by height detection sensor 38, (hereinafter, referred to as measuring point A) constitutes a horizontal upper face portion lying adjacent to an upstream side of opening section 132 opened in upper wall section 131c in the conveyance direction as shown in, for example, FIGS. 10 and 11, or the like. A portion of peeling blade 136, which constitutes a measuring target to be measured by height detection sensor 38, (hereinafter, referred to as measuring point B) constitutes a horizontal upper face portion of peeling blade 136 as shown in, for example, FIGS. 10 and 11, or the like. Since the cutting edge of peeling blade 136 is sharp, measuring point B described above constitutes a horizontal upper face portion positioned further downstream than the position of the cutting edge in the conveyance direction.

Figure 12:
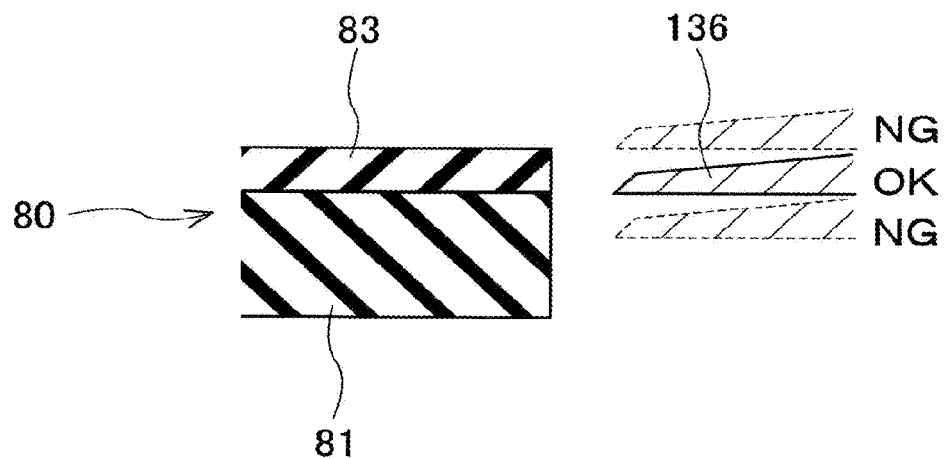
FIG. 12 is a diagram showing a positional relationship between the carrier tape and the peeling blade in relation to a height position.
Figure 13:
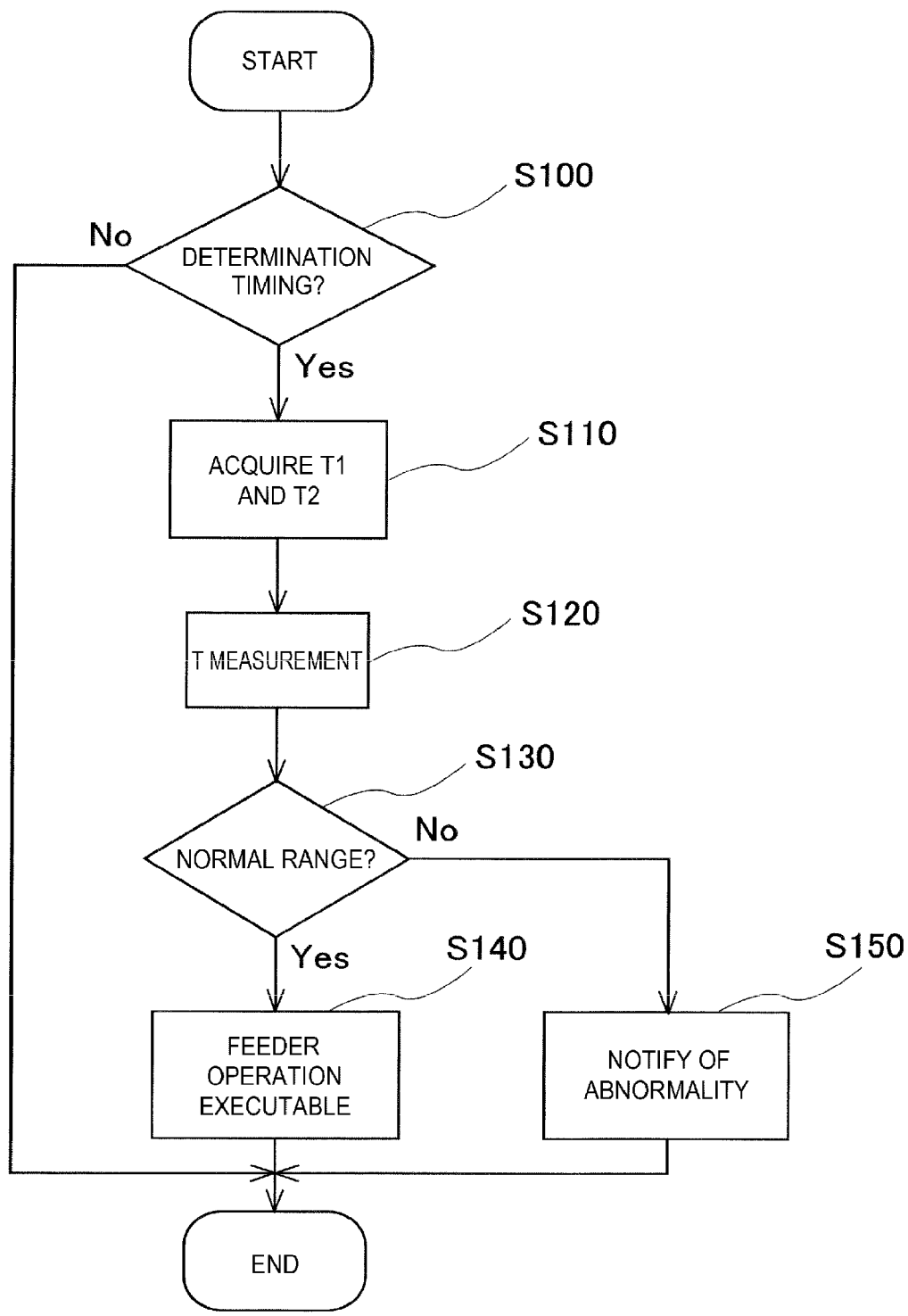
FIG. 13 is a flowchart of an example of a control routine executed in an inspection device of the auto loading feeder of the embodiment.

An output signal of height detection sensor 38 is supplied to control section 3. Control section 3 constitutes a unit made up mainly of a microcomputer. Control section 3 constitutes a device for controlling the operation of component mounter 1 including auto loading feeders 22. Control section 3 executes a processing, which will be described below, at a determination timing (a determination timing in step S100 shown in FIG. 13), which will be described in detail later on. As shown in FIG. 12, this processing is a height confirming processing for determining whether the cutting edge of peeling blade 136 enters between base tape 81 and cover tape 83 of carrier tape 80 which is fed by auto loading feeder 22 as required. Additionally, the determination timing described above is a timing at which peeling blade 136 of auto loading feeder 22 has not yet started peeling of carrier tape 80 (that is, at which the distal end of carrier tape 80 has not yet arrived at peeling blade 136).

Control section 3 measures height position T1 of the upper face of upper wall section 131c of tape guide main body 131 and measures height position T2 of the upper face of peeling blade 136 based on an output signal of height detection sensor 38 which is inputted thereinto (step S110). A measurement of height position T1 and a measurement of height position T2 may be executed with single height detection sensor 38 by positioning height detection sensor 38 in appropriate positions for those measurements at different points in time. Control section 3 measures relative height position T of peeling blade 136 with respect to tape guide main body 131 based on a difference in height between height position T1 of the upper face of upper wall section 131c and height position T2 of the upper face of peeling blade 136 which are measured at the different points in time (step S120).

In measuring the height position of peeling blade 136 with respect to tape guide main body 131 as described above, control section 3 may store or be able to acquire from an exterior host computer both of information on a thickness in the up-down direction of upper wall section 131c of tape guide main body 131 (in particular, preferably, in a position where a reference point of the measuring target which is to be measured by height detection sensor 38 is located) and information on a thickness in the up-down direction of peeling blade 136 (in particular, preferably, in a position where a point of the measuring target which is to be measured by height position sensor 38 is located). Then, control section 3 may measure a height position of the ceiling surface (the rear face) of upper wall section 131c based on height position T1 and the thickness in the up-down direction of the upper face of upper wall section 131c, may measure a height position of a lower face of peeling blade 136 based on height position T2 and the thickness in the up-down direction of the upper face of peeling blade 136, and may measure height position T of peeling blade 136 with respect to tape guide main body 131 based on a difference in height between the height position of the ceiling surface and the height position of the lower face of peeling blade 136.

Additionally, control section 3 may actually measure respective thicknesses in the up-down direction of the height measuring targets for storage. Specifically speaking, when auto loading feeder 22 is initially driven, control section 3 may measure both a height position of the rear face of upper wall section 131c of tape guide main body 131 (in particular, preferably, in a position where a reference point of the measuring target which is to be measured by height detection sensor 38 is located) and a height position of the rear face of peeling blade 136 (in particular, preferably, in a position where a position where a point of the measuring target which is to be measured by height position sensor 38 is located) and may measure both height position T1 of the upper face of upper wall section 131c and height position T2 of the upper face of peeling blade 136 by using height detection sensor 38. Then, control section 3 may store a difference in height between the height position of the rear face and height position T1 of the upper face of upper wall section 131c as the thickness in the up-down direction of upper wall section 131c and may store a different in height between the height position of the rear face and height position T2 of the upper face of peeling blade 136 as the thickness in the up-down direction of peeling blade 136. Even in this case, control section 3 can measure height position T of peeling blade 136 with respect to tape guide main body 131.

Control section 3 stores information on a normal range of height position T of peeling blade 136 with respect to tape guide main body 131. This normal range corresponds to the predetermined height range where the cutting edge of peeling blade 136 is to be positioned with respect to the ceiling surface of upper wall section 131c as the position where peeling blade 136 is to be arranged and is set to the position laying, for example, 0.14 mm to 0.20 mm lower than the ceiling surface of upper wall section 131c.

Control section 3 discriminates whether height position T of peeling blade 136 with respect to tape guide main body 131, which is measured as described above, stays within the normal range (step S130). If control section 3 determines from the discrimination made above that height position T of peeling blade 136 with respect to tape guide main body 131 stays within the normal range, determining that abnormality in height of peeling blade 136 is not generated, control section 3 determines that auto loading feeder 22 can be used (step S140).

On the other hand, if control section 3 determines from the discrimination made above that height position T of peeling blade 136 with respect to tape guide main body 131 is out of the normal range, determining that abnormality in height of peeling blade 136 is being generated, control section 3 determines that auto loading feeder 22 cannot be used. If control section 3 determines on the abnormality in height of peeling blade 136, control section 3 notifies the operator or a managing person of component mounter 1 of the abnormality in height of peeling blade 136 (step S150). In the event that control section 3 determines on the abnormality in height of peeling blade 136, control section may forcibly stop the feeding operation of auto loading feeder 22.

The determination of the abnormality in height of peeling blade 136 made by control section 3 as described above may include a determination of whether the height position of peeling blade 136 with respect to tape guide main body 131 is higher or lower than the normal range. In this case, informing the abnormality in height of peeling blade 136 may include information informing whether the height position of peeling blade 136 is higher or lower than the normal range. Notification of the abnormality in height of peeling blade 136 described above may include displaying a generation of such abnormality on, for example, a monitor screen of component mounter 1. In addition, displaying the generation of such abnormality may prompt an exchange or repair of carrier tape 80 attached to auto loading feeder 22.

The measurement of height position T1 of upper wall section 131c of tape guide main body 131 and the measurement of height position T2 of peeling blade 136, as well as the determination made by control section 3 on whether the abnormality in height of peeling blade 136 exists are preferably executed at any one or more of the following timings in improving the determination accuracy of the abnormality in height or avoiding a peeling error of cover tape 83 or damage to components 60 accommodated in accommodation holes 81a.

The determination timing described above is, for example, a timing at which production of boards 50 using components 60 accommodated in carrier tape 80 attached to auto loading feeder 22 is started. Alternatively, the determination timing is a timing that occurs from the completion of attachment of auto loading feeder 22 to component mounter 1 to a start of picking up of component 60 accommodated in carrier tape 80 with the suction nozzle in component supply position L for removal therefrom. Alternatively, the determination timing is a timing that occurs every time the number of components 60 conveyed to component supply position L for supply in auto loading feeder 22 reaches a predetermined number that is determined in advance. Alternatively, the determination timing is a timing that occurs every time a time after the attachment of auto loading feeder 22 to component mounter 1 or an accumulated time of usage of auto loading feeder 22 exceeds a predetermined time. Alternatively, the determination timing is a timing at which picking up of component 60 with the suction nozzle in component supply position for removal is not executed successfully. Alternatively, the determination timing is a timing at which an error such as chipping or damage is caused to the external appearance of component 60 picked up with the suction nozzle in component supply position L for removal. Alternatively, the determination timing is a timing at which an inspection of auto loading feeder 22 is executed. Alternatively, the determination timing is a timing at which a thermal correction is executed in which a temperature change by heat accompanied by a posture change of height detection sensor 38 attached to mounting head 33 via a bracket is corrected.

When it determines whether abnormality in height of peeling blade 136 exists at the determination timing described above, control section 3 causes Y-axis slider 31 and X-axis slider 32 to position height detection sensor 38 attached to mounting head 33 in the predetermined position above tape guide 130. Then, thereafter, control section 3 measures height position T1 of the upper face of upper wall section 131c and height position T2 of the upper face of peeling blade 136 using height detection sensor 38 and then determines whether the abnormality in height of peeling blade 136 exists.

The predetermined position where height detection sensor 38 is positioned as described above preferably differs between when height position T1 of upper wall section 131c of tape guide main body 131 is measured and when height position T2 of peeling blade 136 is measured. For example, this predetermined position lies directly above measuring point A on upper wall section 131c of tape guide main body 131 when measuring height position T1 of upper wall section 131c and lies directly above measuring point B on peeling blade 136 when measuring height position T2 of peeling blade 136. Height detection sensor 38 is caused to move between the position lying directly above measuring point A on upper wall section 131c and the position lying directly above measuring point B on peeling blade 136 by causing Y-axis slider 31 and X-axis slider 32 to change the position of mounting head 33.

In this way, according to inspection device 2 for auto loading feeder 22 of the present embodiment, relative height position T of peeling blade 136 with respect to tape guide main body 131 of tape guide 130 can be measured. Then, in the event that height position T in question stays within the normal range, the feeding operation of carrier tape 80, that is, the supply of component 60 to component supply position L can be executed as normally, whereas in the event that height position T in question is out of the normal range, the operator or the like can be notified of abnormality in height of peeling blade 136.

Therefore, according to inspection device 2 of the present embodiment, a risk of relative height position T of peeling blade 136 with respect to tape guide main body 131 being out of the normal range to thereby disable peeling blade 136 from peeling off carrier tape 80 can be detected in advance, and when the abnormality in height is detected, the operator or the like can be so notified.

As a result, for example, in the event that the height position of peeling blade 136 is too close to upper wall section 131c of tape guide main body 131 to be out of the normal range while being positioned too high, since it is determined that there is present abnormality in height of peeling blade 136, a risk of the cutting edge of peeling blade 136 sticking into cover tape 83 without entering the boundary between base tape 81 and cover tape 83 of carrier tape 80 can be eliminated, whereby a peeling error in peeling off cover tape 83 from base tape can be avoided. In addition, in the event that the height position of peeling blade 136 is too far away from upper wall section 131c of tape guide main body 131 to be out of the normal range while being positioned too low, since it is determined that there is present abnormality in height of peeling blade 136, a risk of the cutting edge of peeling blade 136 coming into interference with component 60 in accommodation hole 81a of base tape 81 can be eliminated, whereby a failure or damage to component 60 in question or wear of peeling blade 136 can be avoided.

Additionally, height detection sensor 38 constitutes not only a sensor for measuring both height position T1 of upper wall section 131c of tape guide main body 131 and height position T2 of peeling blade 136 but also a sensor for detecting a height position of board 50. That is, measuring height position T of peeling blade 136 with respect to tape guide main body 131 and measuring a height position of board 50 are executed by use of same height detection sensor 38. Information on the height position of board 50 is used for position control and posture control of the suction nozzle of mounting head 33 when component 60 picked up by the suction nozzle is mounted on board 50. Consequently, in measuring height position T of peeling blade 136, since a height detection sensor does not have to be prepared separately from the sensor for measuring a height position of board 50, height position T of peeling blade 136 can be measured without adding a new height detection sensor by using height detection sensor 38 for measuring a height position of board 50, which is existing equipment. As a result, it can be determined whether there is present abnormality in height of peeling blade 136 by measuring height position T of peeling blade 136 with the simple configuration.

In the embodiment described above, discriminating whether relative height position T of peeling blade 136 with respect to tape guide main body 131, which is based on the height difference between height position T1 of the upper face of upper wall section 131c and height position T2 of the upper face of peeling blade 136 which are both measured by control section 3 using height detection sensor 38, stays within the normal range corresponds to a "height discrimination section", and informing of abnormality in height of peeling blade 136 when control section 3 determines from the discrimination that height position T is out of the normal range corresponds to a "abnormality notification section".

In the embodiment described above, height position T1 of upper wall section 131c of tape guide main body 131 and height position T2 of peeling blade 136 are individually measured to determine whether there is present abnormality in height of peeling blade 136 with respect to tape guide main body 131. However, for example, a configuration may be adopted in which whether there is present abnormality in height of peeling blade 136 with respect to tape guide main body 131 is determined by calculating average values of height positions T1, T2 through carrying out measurements of height positions T1, T2 several times at same measuring points A, B and discriminating whether a height difference between the average values so calculated stays within the normal range. According to the configuration of this modification, a determination accuracy with which whether there is present abnormality in height of peeling blade 136 is determined can be improved.

Additionally, in the embodiment described above, whether height position T of peeling blade 136 with respect to tape guide main body 131 stays within the certain normal range is discriminated. However, the embodiment is not limited thereto, and hence, there may be provided multiple ranges, whereby whether height position T of peeling blade 136 with respect to tape guide main body 131 stays within any one of the ranges may be discriminated. For example, a configuration may be adopted in which there are provided a normal range, a warning range, and a driving prohibition range as the multiple ranges, and in the event that height position T stays within the warning range, the operator or the like is notified of a possibility that peeling using peeling blade 136 is disabled in the future, whereas in the event that height position T stays within the driving stopping range, driving auto loading feeder 22 is prohibited, while notifying the operator or the like of the prohibition of driving auto loading feeder 22.

Further, in the embodiment described above, measuring height positions T1, T2 and determining whether there is present abnormality in height of peeling blade 136 can be executed at any timing during the time period from the completion of attachment of auto loading feeder 22 to component mounter 1 to the start of picking up of component 60 accommodated in carrier tape 80 by the suction nozzle in component supply position L for removal. This timing preferably needs to match the timing at which the suction or picking up position of component 60 in component supply position L in auto loading feeder 22 is measured using height detection sensor 38 before the suction nozzle of mounting head 33 picks up component 60 in component supply position L.

Further, in the embodiment described above, the number of height detection sensors 38 attached to mounting head 33 is one. However, multiple height detection sensors 38 may be attached to mounting head 33 in such a manner that a first height detection sensor 38 corresponds to measuring point A and a second height detection sensor 38 corresponds to measuring point B. In this case, two height detection sensors 38 only need to be arranged in a positional relationship matching a relative positional relationship between measuring point A and measuring point B. According to the configuration of this modification, since height position T1 of the upper face of upper wall section 131c of tape guide main body 131 and height position T2 of the upper face of peeling blade 136 can be measured at the same time using two height detection sensors 38, measuring height position T of peeling blade 136 with respect to tape guide main body 131 and hence determining whether there is present abnormality in height of peeling blade 136 can be executed quickly.

Figure 14:
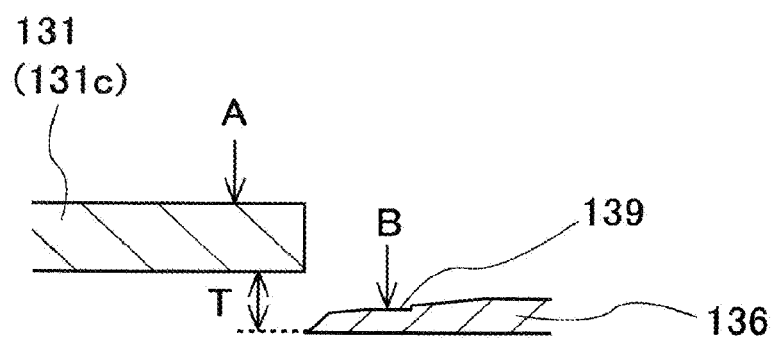
FIG. 14 is a sectional view of an area in the vicinity of a peeling blade of a tape guide of an auto loading feeder according to one modified example.

Furthermore, in the embodiment described above, measuring point B on peeling blade 136, which is the measuring target by height detection sensor 38, constitutes the horizontal upper face located further downstream in the conveyance direction than the position of the sharp cutting edge. However, since the height position of the cutting edge of peeling blade 136 becomes important in peeling off cover tape 83 from base tape 81, in the event that the position spaced away from the position of the cutting edge constitutes measuring point B, there is a possibility that the measuring accuracy with which height position T2 of peeling blade 136 is measured is deteriorated. Then, a configuration may be adopted as shown in FIG. 14 in which a cutout section 139 is provided on an upper face of the cutting edge which slopes down with respect to the horizontally of peeling blade 136 so as to form a horizontal plane, and the horizontal plane provided by cutout section 139 constitutes measuring point B on peeling blade 136. According to this modification, height position T2 of peeling blade 136 can be measured with good accuracy, and the determination accuracy with which whether there is present abnormality in height of peeling blade 136 is determined can be improved.

Measuring point B on peeling blade 136, which constitutes the measuring target to be measured by height detection sensor 38, may be an inclined upper face portion (a slope) in place of the horizontal upper face portion. According to this configuration, although a light receiving amount of height detection sensor 38 can be reduced, whether there is present abnormality in height of peeling blade 136 can be determined by determining a range of the light receiving amount relative to a light irradiation amount. Additionally, measuring point B on peeling blade 136, which constitutes the measuring target to be measured by height detection sensor 38, is set on the inclined upper face portion (the slope), and height detection sensor 38 is arranged in such a manner as to be square to the slope, whereby a reduction in accuracy with which whether there is present abnormality in height of peeling blade 136 is determined can be suppressed.

Figure 15:
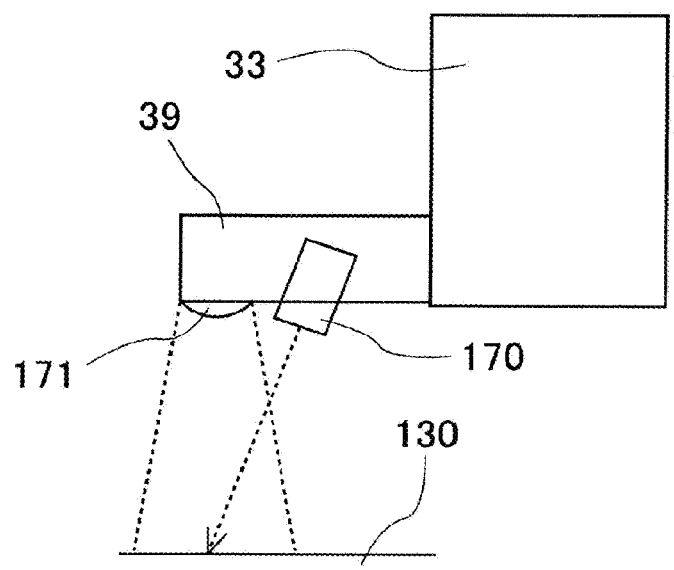
FIG. 15 is a schematic side view of an area in the vicinity of a height detection sensor that is included in an inspection device of an auto loading feeder of another modified example.

In the embodiment described above, height detection sensor 38 is described as being made up of the reflection-type photoelectric sensor having the light projecting section for irradiating light and the light receiving section for receiving reflection light of the light irradiated from the light projecting section. However, the embodiment is not limited thereto. As shown in FIG. 15, height detection sensor 38 may have light projecting section 170 and camera unit 171.

Figure 16:
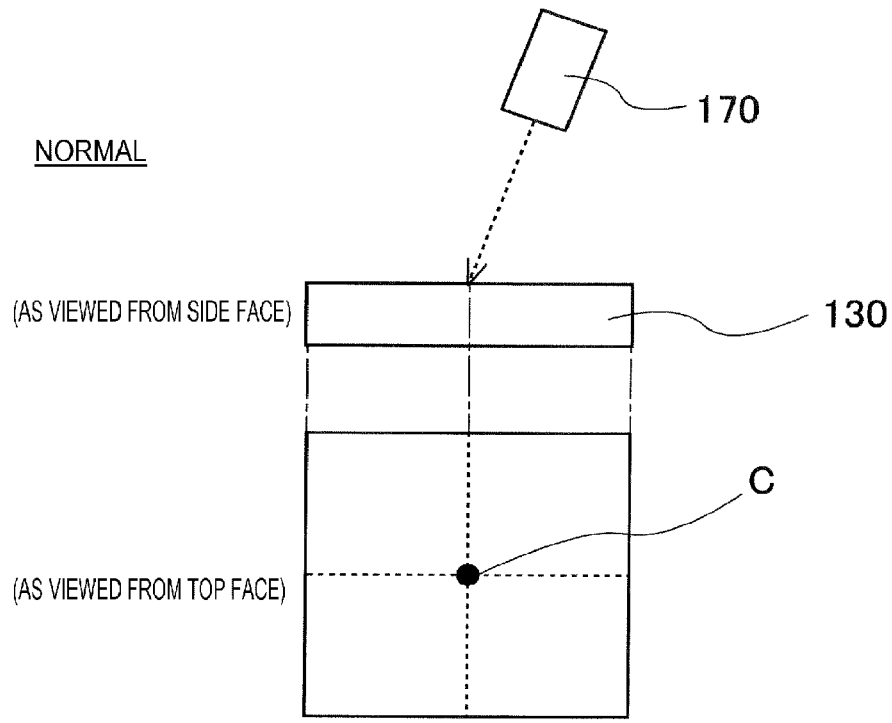
FIG. 16 is a diagram showing a state in which a light projecting section of a light detection sensor draws point C on a front surface of a height measuring target when a height position of the height measuring target is at a normal height.
Figure 17:
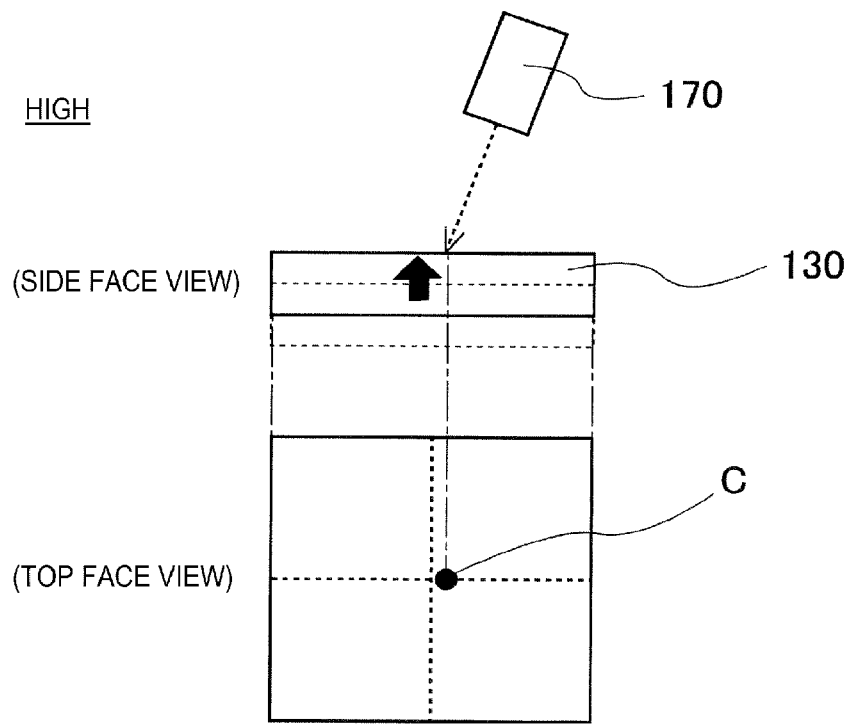
FIG. 17 is a diagram showing a state in which the light projecting section of the light detection sensor draws point C on the front surface of the height measuring target when the height position of the height measuring target is too high.
Figure 18:
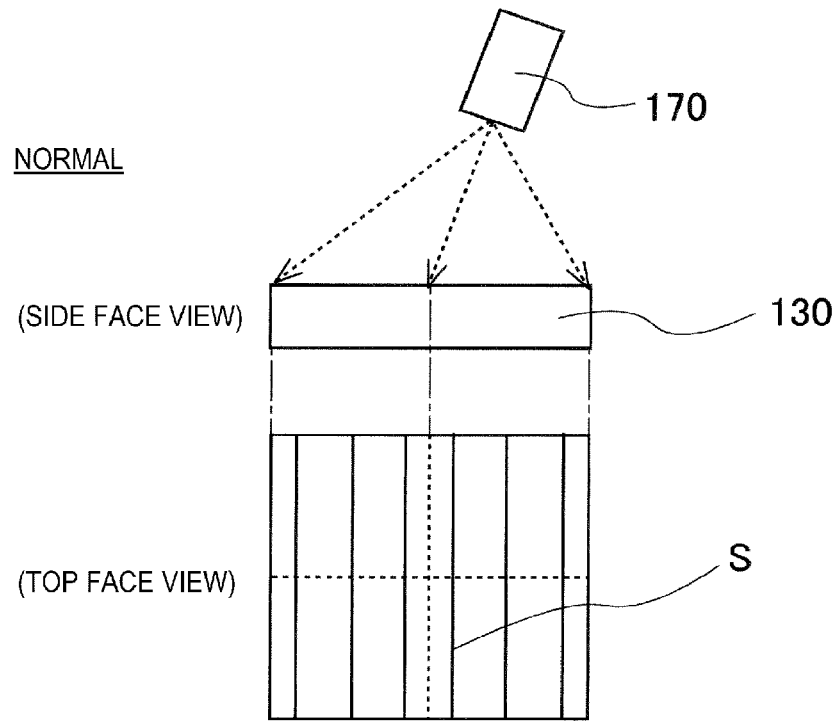
FIG. 18 is a diagram showing a state in which the light projecting section of the light detection sensor draws tripe pattern S on the front surface of the height measuring target when the height position of the height measuring target is at the normal height.
Figure 19:
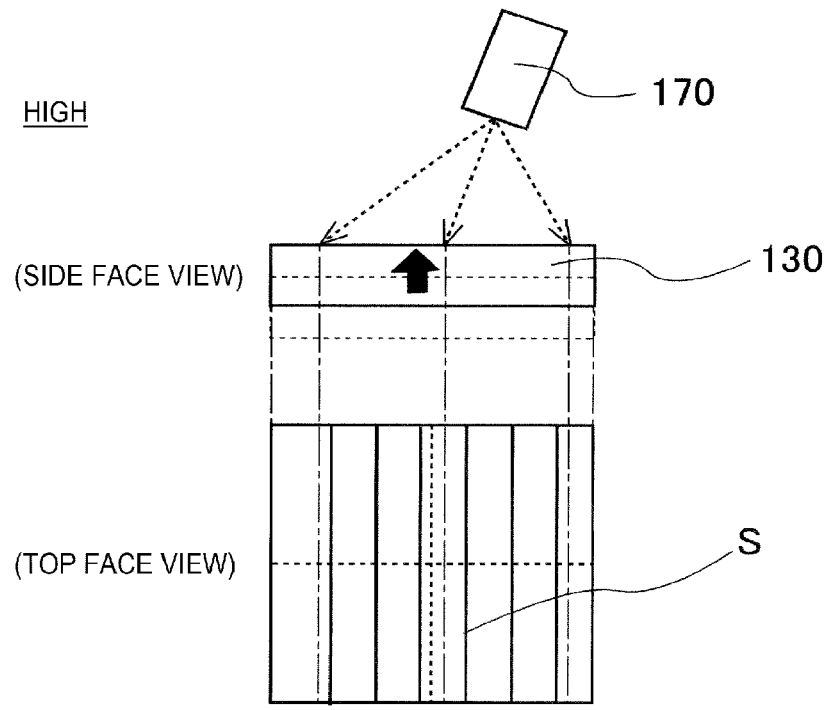
FIG. 19 is a diagram showing a state in which the light projecting section of the height detection sensor draws stripe pattern S on the front surface of the height measuring target when the height position of the height measuring target is too high.

In this modification, light projecting section 170 is a light source for irradiating light with high directivity such as laser. Light projecting section 170 is attached to mounting head 33 via bracket 39 in such a manner that light irradiated therefrom enters obliquely upper wall section 131c of tape guide main body 131, which constitutes the height measuring target on tape guide 130 and peeling blade 136 (specifically speaking, the up-down direction in which the height positions of upper wall section 131c and peeling blade 136 change). Light projecting section 170 can draw point C having a predetermined diameter as shown in FIGS. 16 and 17 or a stripe pattern S in which straight lines are aligned at predetermined intervals as shown in FIGS. 18 and 19 on the surface of upper wall section 131c or peeling blade 136. Additionally, camera unit 171 is arranged directly above upper wall section 131c of tape guide main body 131 and peeling blade 136, which constitute the height measuring targets and is attached to mounting head 33 via bracket 39. Camera unit 171 can image a region including point C or stripe pattern S which is drawn on the surface of upper wall section 131c or peeling blade 136 with light irradiated from light projecting section 170.

In this modification, an incident direction of light irradiated from light projecting section 170 and a direction in which the height positions of the height measuring targets change differ from each other. As a result, as shown, for example, in FIGS. 16 and 17, in the configuration in which light projecting section 170 draws point C on a surface of a height measuring target, assuming that point C drawn by light irradiated from light projecting section 170 is positioned at a center of an imaging region of camera unit 171 when a height position of the height measuring target is at a normal height, in the event that the height position of the height measuring target becomes higher or lower than the normal height, point C drawn by light irradiated from light projecting section 170 comes to deviate from the center of the imaging region of camera unit 171. This deviation amount is proportional to a height variation amount representing a variation of the height position of the height measuring target from the normal height. Similarly, as shown, for example, in FIGS. 18 and 19, in the configuration in which light projecting section 170 draws stripe pattern S on the surface of the height measuring target, assuming that stripe pattern S drawn by light irradiated from light projecting section 170 is drawn within a region imaged by camera unit 171 in such a manner that individual lines are aligned at predetermined intervals when the height position of the height measuring target is at the normal height, in the event that the height position of the height measuring target becomes higher or lower than the normal height, the intervals of the individual lines of stripe pattern S drawn by light irradiated from light projecting section 170 come to vary. This interval variation amount is proportional to a height variation amount by which the height position of the height measuring target varies from the normal height. Consequently, a height position of the height measuring target can be measured by detecting the position of point C or stripe pattern S which is drawn by light irradiated from light projecting section 170 in the region imaged by camera unit 171, as a result of which whether there is present abnormality in height of peeling blade 136 can be determined.

In particular, in the configuration in which light projecting section 170 draws stripe pattern S on the surface of the height measuring target, a three-dimensional shape of the height measuring target can be grasped by detecting a position of stripe pattern S drawn by light irradiated from light projecting section 170 and included in a region imaged by camera unit 171, curvatures, curved positions, and the like of individual lines, thereby making it possible to grasp a deformation of the height measuring target. Also, in the configuration in which light projecting section 170 draws point C on the surface of the height measuring target, in the event that the number of measuring portions where a height position of the height measuring target is measured is increased to multiple portions, the three-dimensional shape of the height measuring target can be grasped to some extent, thereby making it possible to grasp a deformation of the height measuring target to some extent.

Additionally, in place of the modification described above, height detection sensor 38 may only have a camera section without having a light projecting section. In this modification, a reference mark is affixed to upper wall section 131c of tape guide main body 131 of tape guide 130 and the upper surface of peeling blade 136, a height position of the height measuring target is measured by detecting the position of the reference mark included in a region imaged by camera unit 171. In this modification, the camera section may be a range finding streocamera, and the reference mark on upper wall section 131c or the upper surface of peeling blade 136 may be provided at multiple portions which are spaced a predetermined distance apart from each other.

Further, in the embodiment described above, control section 3 is described as storing in advance information on the normal range of height position T of peeling blade 136 with respect to tape guide main body 131 and is described as discriminating whether height position T of peeling blade 136 with respect to tape guide main body 131 which is measured using height detection sensor 38 stays within the normal range. However, the embodiment is not limited thereto. For example, control section 3 may discriminate whether height position T of peeling blade 136 with respect to tape guide main body 131 which is measured using height detection sensor 38 in the current processing stays within a predetermined range based on height position T measured in the previous processing. That is, control section 3 may discriminate whether a variation amount of height position T from the previous processing to the current processing stays within a predetermined range. According to this modification, the operator or the like can be notified of whether height position T of peeling blade 136 with respect to tape guide main body 131 varies largely from the previous processing to the current processing.

Further, in the embodiment described above, inspection device 2 is described as being installed in component mounter 1. However, the embodiment is not limited thereto. Inspection device 2 may be a device provided separately and independently of component mounter 1 for exclusive use for inspection.

The embodiment is not limited to the embodiment and its modifications that have been described heretofore and hence can be modified variously without departing from the sprit and scope of the present disclosure.

REFERENCE SIGNS LIST

1: Electronic component mounter, 2: Inspection device, 3: Control section, 22: Auto loading feeder, 33: Mounting head, 38: Height detection sensor, 50: Board, 60: Electronic component, 80: Carrier tape, 81: Base tape, 81a: Accommodating hole, 83: Cover tape, 100: Feeder main body, 103: Tape conveyance path, 130: Tape guide, 131: Tape guide main body, 131c: Upper wall section, 135: Tape peeling device, 136: Peeling blade, 170: light projecting section, 171: Camera unit.

The invention claimed is:

1. An inspection device for an auto loading feeder having a tape guide main body, extending along a conveyance direction of a carrier tape, in which a cover tape for closing an accommodation section for accommodating an electronic component therein is affixed to a base tape on which the accommodation section is provided, and a peeling blade, extending in the conveyance direction with an cutting edge thereof directed towards an upstream side in the conveyance direction, which is configured to peel off the cover tape from the base tape of the carrier tape guided by the tape guide main body, the inspection device comprising:
a height detection sensor configured to output a first signal corresponding to a height position of a top surface of the tape guide main body as a reference point and a second signal corresponding to a height position of the peeling blade; and
a height discrimination section configured to discriminate, based on a height difference between a height position of the reference point based on the first signal and a height position of the peeling blade based on the second signal, whether a height position of the peeling blade stays within a predetermined range with respect to the carrier tape guided by the tape guide main body, the predetermined range corresponding to a thickness of the cover tape.

2. The inspection device for an auto loading feeder according to claim 1,
wherein the inspection device comprises an abnormality notification section configured to notify of abnormality in height of the peeling blade, the abnormality being notified when the height discrimination section discriminates that a height position of the peeling blade with respect to the carrier tape is out of the predetermined range.

3. The inspection device for an auto loading feeder according to claim 1,
wherein the height discrimination section executes the discrimination at a predetermined timing, and
wherein the predetermined timing is any one or more of: a timing when a production using the electronic component is started; a timing that occurs at any time during a time period from completion of attachment of the auto loading feeder to an electronic component mounter to start of a removal of the electronic component in a component supply position; a timing that occurs every time a number of the electronic components conveyed to the component supply position for supply reaches a predetermined number; a timing that occurs every time a predetermined time period elapses; a timing when removal of the electronic component in the component supply position does not succeed; a timing when an error in external appearance of the electronic component removed in the component supply position is generated; a timing when an inspection of the auto loading feeder is executed; and a timing when a thermal correction is executed.

4. The inspection device for an auto loading feeder according to claim 1,
wherein the height detection sensor is a photoelectric sensor comprising a light projecting section configured to irradiate light individually towards the tape guide main body and the peeling blade, and a light receiving section configured to receive reflected light of light irradiated from the light projecting section.

5. The inspection device for an auto loading feeder according to claim 1,
wherein the height detection sensor comprises a light projecting section configured to irradiate light individually towards the tape guide main body and the peeling blade, and a camera section configured to image respective surfaces of the tape guide main body and the peeling blade onto which light is irradiated individually.

6. The inspection device for an auto loading feeder according to claim 1,
wherein the reference point is a portion which is positioned further upstream in the conveyance direction than a position of the cutting edge on an upper face of an upper wall section of the tape guide main body.

7. The inspection device for an auto loading feeder according to claim 1,
wherein a measuring point of a height position of the peeling blade is an upper face portion of a distal end portion of the peeling blade.

8. The inspection device for an auto loading feeder according to claim 7,
wherein a measuring point of a height position of the peeling blade is a flat plane portion provided horizontally on an upper face of a distal end portion of peeling blade.

9. An electronic component mounter in which an auto loading feeder is installed,
the auto loading feeder having a tape guide main body, extending along a conveyance direction of a carrier tape, in which a cover tape for closing an accommodation section for accommodating an electronic component therein is affixed to a base tape on which the accommodation section is provided, and a peeling blade, extending in the conveyance direction with an cutting edge thereof directed towards an upstream side in the conveyance direction, which is configured to peel off the cover tape from the base tape of the carrier tape guided by the tape guide main body, and the electronic component mounter further including a transfer head configured to change its position for transfer of the electronic component in the accommodation section on the base tape from which the cover tape is peeled off, the electronic component mounter comprising:

a height detection sensor attached to the transfer head, and configured to output a first signal corresponding to a height position of a top surface of the tape guide main body as a reference point and a second signal corresponding to a height position of the peeling blade; and a height discrimination section configured to discriminate, based on a height difference between a height position of the reference point based on the first signal and a height position of the peeling blade based on the second signal, whether a height position of the peeling blade stays within a predetermined range with respect to the carrier tape guided by the tape guide main body, the predetermined range corresponding to a thickness of the cover tape.

* * * * *